(12) United States Patent
Kishimoto et al.

(10) Patent No.: US 11,211,576 B2
(45) Date of Patent: Dec. 28, 2021

(54) ORGANIC LIGHT EMITTING DEVICE AND METHOD OF MANUFACTURING THE SAME

(71) Applicant: SAMSUNG DISPLAY CO., LTD., Yongin-si (KR)

(72) Inventors: Katsushi Kishimoto, Seoul (KR); Yoon Ho Kang, Yongin-si (KR); Dong Hoon Kwak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 16/777,549

(22) Filed: Jan. 30, 2020

(65) Prior Publication Data

US 2020/0168830 A1    May 28, 2020

Related U.S. Application Data

(62) Division of application No. 15/441,717, filed on Feb. 24, 2017, now abandoned.

(30) Foreign Application Priority Data

Jun. 1, 2016 (KR) .................. 10-2016-0068279

(51) Int. Cl.
*H01L 51/56* (2006.01)
*H01L 51/50* (2006.01)
(Continued)

(52) U.S. Cl.
CPC ...... *H01L 51/5088* (2013.01); *H01L 51/5008* (2013.01); *H01L 51/5012* (2013.01);
(Continued)

(58) Field of Classification Search
CPC .................................................. H01L 51/5088
See application file for complete search history.

(56) References Cited

U.S. PATENT DOCUMENTS

2003/0137325 A1\* 7/2003 Yamazaki ........... H01L 27/3216
327/80
2005/0136288 A1 6/2005 Lee et al.
(Continued)

FOREIGN PATENT DOCUMENTS

JP    2005-093700 A    4/2005
JP    2009-112999 A    5/2009
(Continued)

OTHER PUBLICATIONS

A.K.G. Tapia, et al., "FTIR and XPS Analyses of Thermally Aged Polyaniline Emeraldine Films: Relationship to Morphological and Electrical Properties After Doping," Journal of Nuclear and Related Technologies, vol. 6, No. 2, Dec. 2009, pp. 27-40.

*Primary Examiner* — Austin Murata
(74) *Attorney, Agent, or Firm* — Lewis Roca Rothgerber Christie LLP

(57) ABSTRACT

An organic light-emitting device including an anode electrode, a hole injection layer on the anode electrode, a hole transport layer on the hole injection layer, an emissive layer on the hole transport layer, and a cathode electrode on the emissive layer. A material of the hole injection layer includes a nitrogen-containing compound having a quinoid structure and a nitrogen-containing compound having a benzenoid structure. A ratio of a peak intensity $I_B$ to a peak intensity $I_A$ ($I_B/I_A$) in a Fourier transform infrared spectroscopy (FTIR) spectrum of the material of the hole injection layer ranges from 1.5 to 2.5, the peak intensity $I_A$ and the peak intensity $I_B$ being further defined.

9 Claims, 19 Drawing Sheets

(51) Int. Cl.
 *H01L 51/52* (2006.01)
 *H01L 51/00* (2006.01)
(52) U.S. Cl.
 CPC ...... *H01L 51/5056* (2013.01); *H01L 51/5206* (2013.01); *H01L 51/5221* (2013.01); *H01L 51/56* (2013.01); H01L 51/0026 (2013.01); H01L 51/0059 (2013.01); H01L 51/5004 (2013.01); H01L 51/5064 (2013.01); H01L 2251/552 (2013.01)

(56) References Cited

U.S. PATENT DOCUMENTS

| | | | |
|---|---|---|---|
| 2007/0116984 A1 | 5/2007 | Park et al. | |
| 2007/0148494 A1 | 6/2007 | Kambe et al. | |
| 2013/0112966 A1* | 5/2013 | Sassa | H01L 51/0097 257/40 |
| 2013/0168665 A1* | 7/2013 | Zhou | H01L 51/0035 257/40 |
| 2015/0287926 A1* | 10/2015 | Imai | C09D 11/106 257/40 |
| 2017/0213967 A1* | 7/2017 | Chen | H01L 51/4246 |
| 2018/0123045 A1* | 5/2018 | Iwasaki | H05B 33/04 |
| 2018/0175298 A1* | 6/2018 | Sassa | H01L 51/0097 |

FOREIGN PATENT DOCUMENTS

| | | |
|---|---|---|
| JP | 2009-245644 A | 10/2009 |
| JP | 2009-266814 A | 11/2009 |

* cited by examiner baking

Cooling baking

ORGANIC LIGHT EMITTING DEVICE AND METHOD OF MANUFACTURING THE SAME

CROSS-REFERENCE TO RELATED APPLICATIONS

This application is a divisional of U.S. patent application Ser. No. 15/441,717, filed on Feb. 24, 2017, which claims priority to and the benefit of Korean Patent Application No. 10-2016-0068279, filed on Jun. 1, 2016, in the Korean Intellectual Property Office, and entitled: "Organic Light Emitting Device and Method of Manufacturing the Same," is incorporated by reference herein in its entirety.

BACKGROUND

1. Field

Embodiments to an organic light-emitting device and a method of manufacturing the organic light-emitting device.

2. Description of the Related Art

An organic light-emitting device (OLED) is a self-luminous display device. An OLED device has wide viewing angle, good contrast ratio, fast response speed, good luminance and good driving voltage characteristics, and can represent a variety of colors.

In a typical organic light-emitting device, an anode is formed on a substrate, and a hole transport layer, an emissive layer, an electron transport layer and a cathode are sequentially formed one on another. The hole transport layer, the emissive layer and the electron transport layer are made mainly of organic compounds. When a voltage is applied across the anode and the cathode, holes injected from the anode move to the emissive layer via the hole transport layer, while electrons injected from the cathode move to the emissive layer via the electron transport layer. Carriers such as holes and electrons recombine in the emissive layer to create excitons. Light is generated as energy is released when the excitons relax from an excited state to the ground state.

SUMMARY

Embodiments are directed to an organic light-emitting device including an anode electrode, a hole injection layer on the anode electrode, a hole transport layer on the hole injection layer, an emissive layer on the hole transport layer, and a cathode electrode on the emissive layer. A material of the hole injection layer includes a nitrogen-containing compound having a quinoid structure and a nitrogen-containing compound having a benzenoid structure. A ratio of a peak intensity $I_B$ to a peak intensity $I_A$ ($I_B/I_A$) in a Fourier transform infrared spectroscopy (FTIR) spectrum of the material of the hole injection layer ranges from 1.5 to 2.5. The peak intensity $I_A$ is a peak intensity of a C=N bond of the quinoid structure in the material of the hole injection layer at a wavelength from 1632.5 cm$^{-1}$ to 1548.4 cm$^{-1}$, and the peak intensity $I_B$ is a peak intensity of the benzenoid structure in the material of the hole injection layer at a wavelength from 1521.6 cm$^{-1}$ to 1466.3 cm$^{-1}$ in the Fourier transform infrared spectroscopy (FTIR) spectrum of the material of the hole injection layer.

A ratio of a peak intensity $I_C$ to the peak intensity $I_B$ ($I_C/I_B$) may be greater than 0 and equal to or less than 10, wherein the peak intensity $I_C$ is a peak intensity of the material of the hole injection layer at a wavelength from 1350.0 cm$^{-1}$ to 1300.0 cm$^{-1}$.

A ratio of a peak intensity $I_D$ to the peak intensity $I_B$ ($I_D/I_B$) may be greater than 0 and equal to or less than 5, wherein the peak intensity $I_D$ is a peak intensity of C—O—C bond in the material of the hole injection layer at a wavelength from 1100.0 cm$^{-1}$ to 1050.0 cm$^{-1}$.

A content of compounds having a cross-linked benzenoid structure in the material of the hole injection layer may range from 7 mol % to 15 mol % with respect to total compounds of the hole injection layer.

The organic light-emitting device may further include a first interface layer between the hole injection layer and the hole transport layer. A content of oxygen atoms in the first interface layer may be $3 \times 10^{21}$ O/cm$^3$ or more.

A lowest unoccupied molecular orbital (LUMO) energy level of the first interface layer may be equal to or greater than a LUMO energy level of the hole injection layer.

An absolute value of a difference between a highest occupied molecular orbital (HOMO) energy level of the first interface layer and a HOMO energy level of the hole injection layer may be less than 0.2 eV.

The organic light-emitting device may further include a second interface layer between the hole transport layer and the emissive layer. A content of oxygen atoms in the second interface layer may be $10^{19}$ O/cm$^3$ or less.

A HOMO energy level of the second interface layer may be less than a HOMO energy level of the emissive layer.

An absolute value of a difference between a HOMO energy level of the second interface layer and a HOMO energy level of the hole transport layer may be greater than 0.8 eV.

Embodiments are also directed to a method of manufacturing an organic light-emitting device including preparing an anode electrode, forming a hole injection layer on the anode electrode by providing a hole injection material on the anode electrode and baking the hole injection material to form the hole injection layer, forming a hole transport layer on the hole injection layer by providing a hole transport material on the hole injection layer and baking the hole transport material to form the hole transport layer, and forming an emissive layer on the hole transport layer. Baking the hole injection material includes a first interval in which a conductivity of the hole injection material increases over a baking time, and a second interval in which the conductivity of the hole injection material decreases over a baking time after the first interval. The hole injection material has a maximum conductivity between the first interval and the second interval. Baking the hole injection material includes baking the hole injection material such that the conductivity of the hole injection material is half, or less than half, of the maximum conductivity.

Forming the hole injection layer on the anode electrode may further include cooling the baked hole injection layer. The cooling may include cooling the hole injection layer at a rate of change in average temperature per unit time of $-30°$ C./minute.

The cooling may include cooling the hole injection layer in a mixed gas atmosphere containing nitrogen and oxygen. A volume ratio between nitrogen and oxygen in the mixed gas may range from 75:25 to 85:15. A content of moisture in the mixed gas may be 1 ppm or less.

Baking the hole injection material may include baking the hole injection material by varying a temperature inside a chamber from a first temperature to a second temperature higher than the first temperature, and then to a third temperature. Cooling the hole injection layer may include cooling the hole injection layer by varying the third temperature to a fourth temperature lower than the third temperature. A rate of change in temperature per unit time from the first temperature to the second temperature may be greater than a rate of change in temperature per unit time from the second temperature to the third temperature.

Forming the hole transport layer on the hole injection layer may further include cooling the baked hole transport layer. Cooling the hole transport layer may include cooling the hole transport layer at a rate of change in average temperature per unit time of −30° C./minute or more.

Cooling the hole transport layer may include cooling the hole transport layer in a pure nitrogen gas atmosphere. A content of noise in the pure nitrogen gas may be 10 parts per billion (ppb) or less.

Cooling the hole transport layer may include cooling the hole transport layer in a mixed gas atmosphere containing nitrogen and oxygen. A content of moisture in the mixed gas may be 10 ppb or less, and a content of oxygen with respect to the mixed gas may be 1 ppm or less.

Cooling the hole transport layer may include cooling the hole transport layer in a mixed gas atmosphere containing nitrogen and inert gas, the inert gas including hydrogen or carbon monoxide. A content of moisture in the mixed gas may be 10 ppb or less, and a content of the inert gas with respect to the mixed gas may be 1 volume % or less.

Baking the hole transport material may include baking the hole transport material by varying a temperature inside a chamber from a fifth temperature to a sixth temperature higher than the fifth temperature, and then to a seventh temperature. Cooling the hole transport layer includes cooling the hole transport layer by varying the seventh temperature to an eighth temperature lower than the seventh temperature. A rate of change in temperature per unit time from the fifth temperature to the sixth temperature may be greater than a rate of change in temperature per unit time from the sixth temperature to the seventh temperature.

Embodiments are also directed to a method of manufacturing an organic light-emitting device including preparing an anode electrode, forming a hole injection layer on the anode electrode by providing a hole injection material on the anode electrode and baking the hole injection material to form the hole injection layer, the hole injection material containing a nitrogen-containing compound having a quinoid structure and a nitrogen-containing compound having a benzenoid structure, forming a hole transport layer on the hole injection layer, and forming an emissive layer on the hole transport layer. Baking the hole injection material includes baking the hole injection material such that a ratio of a peak intensity $I_B$ to a peak intensity $I_A$ ($I_B/I_A$) in a Fourier transform infrared spectroscopy (FTIR) spectrum of the material of the hole injection layer ranges from 1.5 to 2.5. The peak intensity $I_A$ is a peak intensity of a C=N bond of the quinoid structure in the material of the hole injection layer at a wavelength from 1632.5 $cm^{-1}$ to 1548.4 $cm^{-1}$, and the peak intensity $I_B$ is a peak intensity of the benzenoid structure in the material of the hole injection layer at a wavelength from 1521.6 $cm^{-1}$ to 1466.3 $cm^{-1}$ in the Fourier transform infrared spectroscopy (FTIR) spectrum of the material of the hole injection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
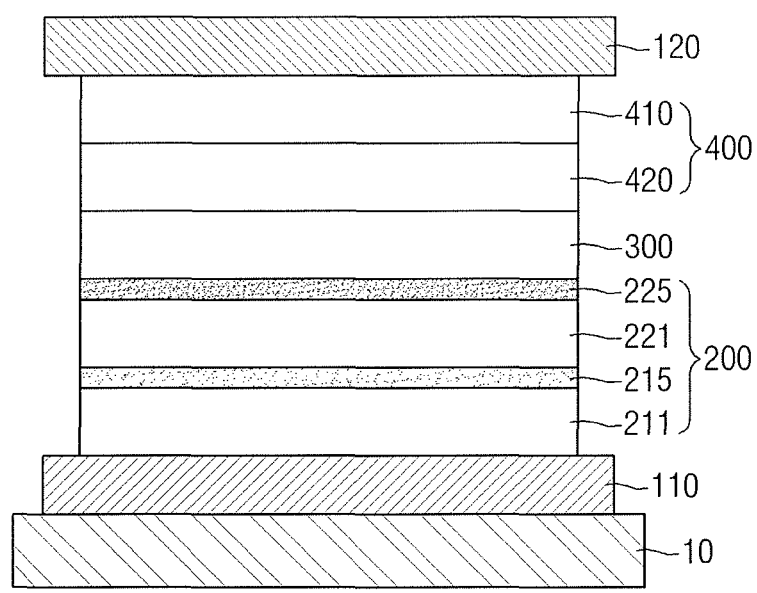
FIG. 1 illustrates a cross-sectional view schematically showing an organic light-emitting device according to an exemplary embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

FIG. 1 illustrates a cross-sectional view schematically showing an organic light-emitting device according to an exemplary embodiment.

Referring to FIG. 1, the organic light-emitting device may include a substrate 10, an anode electrode 110, a hole transfer layer 200, an emissive layer 300, an electron transfer layer 400, and a cathode electrode 120. The voltage applied to the anode electrode 110 may be different from the voltage applied to the cathode electrode 120.

The substrate 10 may be an insulation substrate. The insulation substrate may be made of glass, quartz and polymer resin, etc. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP) or combinations thereof. In some embodiments, the insulation substrate may be a flexible substrate made of a flexible material such as polyimide (PI).

The anode electrode 110 may be disposed on the substrate 10. When a voltage is applied to the anode electrode 110, holes are injected. The anode electrode 110 may include a conductive material having a work function greater than that of the cathode electrode 120 to be described below. When the anode electrode 110 has a larger work function, holes may be injected easily. The anode electrode 110 may include, for example, indium tin oxide (ITO), indium zinc oxide (IZO), zinc oxide, indium oxide, etc. In an exemplary embodiment, the work function of the anode electrode 110 may range approximately from 4.9 to 5.0 eV. Herein, the term "work function" refers to the minimum energy required to remove an electron from the surface of a material.

In some embodiments, the anode electrode may further include a reflective material such as silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a combination thereof, in addition to the above-mentioned conductive materials. In this case, the anode electrode may have a single layer structure made up of the conductive material or the reflective material, or may have a multi-layer structure in which the materials are stacked on one another. When the anode electrode has a multi-layer structure, the uppermost layer adjacent to the hole injection layer 211 may be made of a conductive material having a relatively large work function. When the organic light-emitting device is employed in an OLED device, the anode electrode 110 may be disposed in each pixel area.

The hole transport layer 200 may be disposed on the anode electrode 110. In an exemplary embodiment, the hole transfer layer 200 may include a hole injection layer 211, a first interface layer 215, a hole transport layer 221 and a second interface layer 225.

For example, the hole injection layer 211 may be disposed on the anode electrode 110. The hole injection layer 211 may lower the energy barrier for hole injection between the anode electrode 110 and the hole transport layer 221 to thereby increase the efficiency of hole injection from the anode electrode 110 to the emissive layer 300. To this end, the hole injection layer 211 may be made of a material having an appropriate conductivity, a highest occupied molecular orbital (HOMO) energy level, and a lowest unoccupied molecular orbital (LUMO) energy level. For example, the hole injection layer 211 may include a phthalocyanine compound such as copper phthalocyanine (CuPc), m-MTDATA(4,4',4"-tris(N-3-methylphenyl-N-phenylamino)triphenylamine), TDATA(4,4',4"-tris(diphenylamino)triphenylamine), 2-TNATA(4,4',4"-tris[2-naphthyl(phenyl)-amino]triphenyl-amine), Pani/DB SA (polyaniline/dodecylbenzenesulfonic acid), PEDOT/PSS(poly(3,4-ethylene dioxythiophene)/polystyrene sulfonate), PANI/CSA (polyaniline/camphorsulfonic acid) or PANI/PSS (polyaniline/polystyrene sulfonate). Such hole injection materials may be provided by, for example, a method for applying a solution, such as inkjet printing or nozzle printing.

In an exemplary embodiment, the hole injection layer 211 may include a compound containing benzenoid structure and/or quinoid structure, and a solvent of approximately 1 weight % or less. For example, the solvent may be 1,3-dimethyl-2-imidazolidinone (DMI) or propylene glycol (PG). The compound containing the benzenoid structure and/or quinoid structure may include a compound having the structure expressed as Formula 1, a compound having the structure expressed as Formula 2, and a compound having the structure expressed as Formula 3 below:

[Chemical Formula 1]

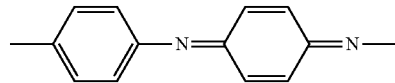

(benzenoid and quinoid structure)

[Chemical Formula 2]

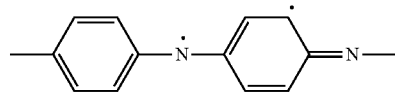

(benzenoid structure)

[Chemical Formula 3]

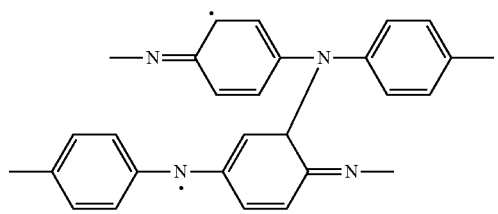

(cross-linked benzenoid structure)

If the hole injection layer 211 is produced via an inkjet printing process, the inkjet printing process may include supplying a hole injection material onto the anode electrode 110 and then carrying out a thermal process such as baking. During the thermal process of the hole injection material containing the structure expressed as Formula 1, in at least some of the structures expressed as Formula 1 having the benzenoid structure and quinoid structure, one covalent bond that forms one of double bonds in the quinoid structure may be broken, forming unpaired electrons. For example, the structure may be changed to the structure expressed as Formula 2, such that the quinoid structure may be gone. As a result, during the process of changing from Formula 1 to Formula 2 via the thermal process, a ratio of the benzenoid structure to the quinoid structure (benzenoid/quinoid) may be increased. In addition, the structure expressed as Formula 2 may contribute to an increase in the conductivity of the hole injection layer 211. The unpaired electron of a nitrogen atom and/or the unpaired electron of a ring derived from the quinoid structure in Formula 2 may work as a free bonding for forming a bond with an external impurity, e.g., an oxygen atom.

Further, during a subsequent thermal process of the hole injection material, cross-linkage may be created between the structures expressed as Formula 2. For example, cross-linkage may be created between the unpaired electron of the nitrogen atom and the unpaired electron of the ring derived from the quinoid structure. To create the cross-linkage structure expressed as Formula 3, a sufficient amount of the structures expressed as Formula 2 are required in the hole injection material. Therefore, an increase in the content of the cross-linkage structures expressed as Formula 3 may provide an increase in a ratio of the benzenoid structures to the quinoid structures (benzenoid/quinoid). In an exemplary embodiment, the portion of the compounds having the cross-linked benzenoid structures expressed as Formula 3 in the material of the hole injection layer 211 may range approximately from 7 wt % to 15 wt % with respect to the total compounds of the hole injection layer 211. Within the above range, the lifetime characteristics of the organic light-emitting device including the hole injection layer 211 may be improved. In addition, the cross-linkage structure expressed as Formula 3 may contribute to a decrease in the conductivity of the hole injection layer 211. The unpaired electron of the nitrogen atom and/or the unpaired electron of the ring derived from the quinoid structure in Formula 3 may work as a free bonding for forming a bond with an external impurity, e.g., an oxygen atom.

It is to be understood that cross-linkage may be created between an unpaired electron of a nitrogen atom and an unpaired electron of another nitrogen atom, or between an unpaired electron of a ring derived from a quinoid structure and an unpaired electron of a ring derived from another quinoid structure, unlike Formula 3.

In this case, in the Fourier transform infrared spectroscopy (FTIR) of the material of the hole injection layer 211, a ratio of a peak intensity $I_B$ of a benzenoid structure in the material of the hole injection layer 211 at 1521.6 cm$^{-1}$ to 1466.3 cm$^{-1}$ to a peak intensity $I_A$ of a quinoid structure in the material of the hole injection layer 211 at 1632.5 cm$^{-1}$ to 1548.4 cm$^{-1}$ ($I_B/I_A$) may be approximately 1.5 to 2.5, approximately 1.6 to 2.0, or approximately 1.75. The term "peak intensity $I_A$ of the quinoid structure at 1632.5 cm$^{-1}$ to 1548.4 cm$^{-1}$" refers to the peak intensity for a C=N bond of the quinoid structure at 1632.5 cm$^{-1}$ to 1548.4 cm$^{-1}$. The term "peak intensity $I_B$ of the benzenoid structure at 1521.6 cm$^{-1}$ to 1466.3 cm$^{-1}$" refers to the peak intensity for a resonance structure of a benzene ring of the benzenoid structure at 1521.6 cm$^{-1}$ to 1466.3 cm$^{-1}$.

The peak intensity may correspond to the peak area of the FTIR spectrum. For example, the peak area may be obtained by a direct integration method. A another example, assuming a peak of the FTIR spectrum as Gaussian distribution, the peak area may be expressed as a multiple of the height of the peak by a half-value width.

In addition, in the spectrum analysis by FTIR of the material of the hole injection layer 211, a ratio of a peak intensity $I_C$ of the material of the hole injection layer 211 at 1350.0 cm$^{-1}$ to 1300.0 cm$^{-1}$ to the peak intensity $I_B$ of the benzenoid structure in the material of the hole injection layer 211 at 1521.6 cm$^{-1}$ to 1466.3 cm$^{-1}$ ($I_C/I_B$) may be greater than 0 and equal to or less than approximately 10.0. For example, the peak intensity $I_C$ at 1350.0 cm$^{-1}$ to 1300.0 cm$^{-1}$ may be a peak intensity of an amide.

In addition, in the spectrum analysis by FTIR of the material of the hole injection layer 211, a ratio of a peak intensity $I_D$ of a C—O—C bond in the material of the hole injection layer 211 at 1100.0 cm$^{-1}$ to 1050.0 cm$^{-1}$ to the peak intensity $I_B$ of the benzenoid structure in the material of the hole injection layer 211 at 1521.6 cm$^{-1}$ to 1466.3 cm$^{-1}$ ($I_D/I_B$) may be greater than 0 and equal to or less than approximately 5.0.

When one or more of the ratios $I_B/I_A$, $I_C/I_B$ and $I_D/I_B$ lie within the above ranges, the lifetime characteristics of the organic light-emitting device may be improved. Such effects will be described in detail below with reference to Examples, Comparative Examples and Experimental Examples.

The first interface layer 215 may be interposed between the hole injection layer 211 and the hole transport layer 221. The first interface layer 215 may be a surface layer formed on the surface of the hole injection layer 211 facing the hole transport layer 221.

In an exemplary embodiment, the first interface layer 215 may be a stabilization layer that is oxidized when an unpaired electron of the structure expressed by Formula 2 and/or Formula 3 is exposed via the surface of the hole injection layer 211 and the unpaired electron forms a bond with an external impurity, e.g., oxygen atom. In this case, the content of the oxygen atoms in the first interface layer 215 may be 3×10$^{21}$ O/cm$^3$ (the number of oxygen atoms/cm$^3$) or more. By forming the oxidized interface layer on the surface of the hole injection layer 211, the first interface layer 215 may include oxygen atoms greater than the above range, such that the difference between the HOMO energy level of the first interface layer 215 and the HOMO energy level of the hole injection layer 211 is lowered, thereby facilitating the transportation of holes. For example, the LUMO energy level of the first interface layer 215 may be substantially equal to or greater than the LUMO energy level of the hole injection layer 211, and the HOMO energy level of the first interface layer 215 may be less than the HOMO energy level of the hole injection layer 211. In addition, the absolute value of the difference between the HOMO energy level of the first interface layer 215 and the HOMO energy level of the hole injection layer 211 may be approximately 0.2 eV or less.

Figure 2:
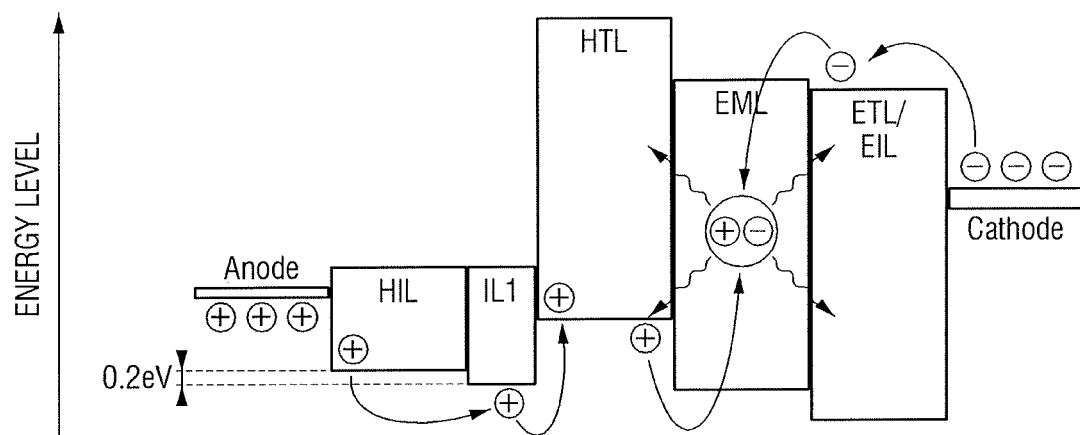
FIG. 2 illustrates a band gap diagram showing luminous efficiency characteristics of an organic light-emitting device including a first interface layer that is a stabilization layer.

FIG. 2 illustrates a band gap diagram depicting luminous efficiency characteristics of an organic light-emitting device including the first interface layer, where the first interface layer is a stabilization layer.

Referring to FIG. 2, for an organic light-emitting device including the first interface layer in which the content of oxygen atoms is approximately 3×10$^{21}$ O/cm$^3$ or more, the LUMO energy level of the hole injection layer HIL may be substantially equal to the LUMO energy level of the stabilization layer (the first interface layer IL1), and the difference between the HOMO energy level of the hole injection layer HIL and the HOMO energy level of the stabilization layer IL1 may be small, for example, approximately 0.2 eV or less. Therefore, the energy barrier between the hole injection layer and the stabilization layer may be low, and holes supplied from the anode electrode may be easily injected. Accordingly, the luminous efficiency characteristics, i.e., luminance characteristics of the organic light-emitting device may be improved, as well as lifetime characteristics of the organic light-emitting device.

Figure 3:
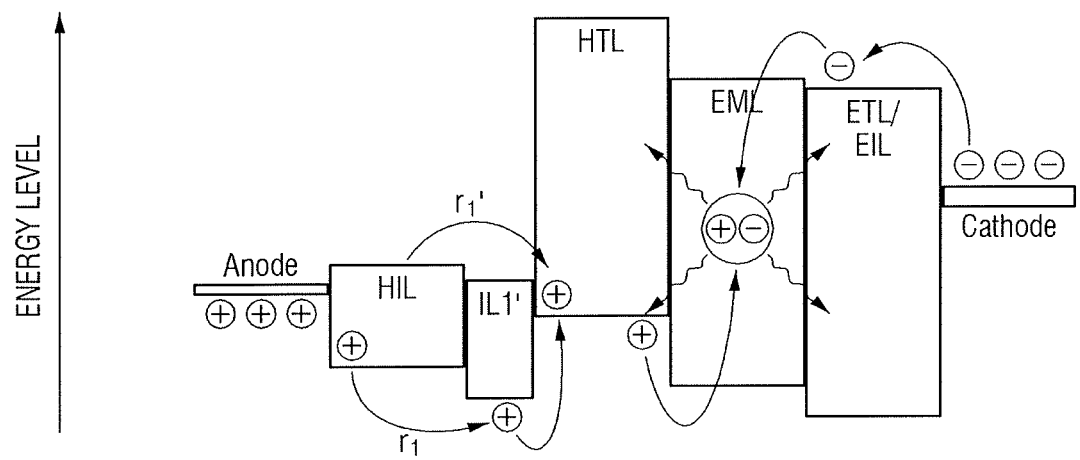
FIG. 3 illustrates a band gap diagram showing luminous efficiency characteristics of an organic light-emitting device including a first interface layer that is a defective layer.

FIG. 3 illustrates a band gap diagram depicting luminous efficiency characteristics of an organic light-emitting device including the first interface layer, where the first interface layer is a defective layer.

Referring to FIG. 3, for an organic light-emitting device including a first interface layer in which the content of oxygen atoms is less than $3\times10^{21}$ O/cm$^3$, the LUMO energy level of the hole injection layer HIL is higher than the LUMO energy level of a defective layer (the first interface layer IL1'), and the difference between the HOMO energy level of the hole injection layer HIL and the HOMO energy level of the defective layer IL1' is large. Therefore, the holes supplied from the anode electrode may move in a leakage path r1' along the LUMO energy level of the defective layer IL1', in addition to a normal path r1 along the HOMO energy level of the defective layer IL1'. As a result, the luminous efficiency characteristics may be degraded.

Referring back to FIG. 1, the hole transport layer 221 may be disposed on the first interface layer 215. The hole transport layer 221 may deliver holes supplied from the hole injection layer 211 and the first interface layer 215 toward the emissive layer 300. In an exemplary embodiment, the HOMO energy level of the hole transport layer 221 may be substantially less than the work function of the material of the anode electrode 110, and may be substantially greater than the HOMO energy level of the emissive layer 300.

The hole transport layer 221 may include, for example, one of TPA (terephthalic acid), TPTE, NPD (4,4'-bis[N-(1-naphthyl)-N-phenyl-amino] biphenyl), TPD (N,N'-diphenyl-N,N'-bis[3-methylphenyl]-1,1'-biphenyl-4,4'-diamine), NPB (N,N'-di(naphthalene-1-yl)-N,N'-diphenyl-benzidine), s-TAD (2,2',7,7'-tetrakis-(N,N-diphenylamino)-9,9'-spirobifluoren), and m-MTDATA (4,4',4"-tris(N-3-methylphenyl-N-henylamino)triphenylamine).

The hole transport layer 221 may further include a charge generation material for improving conductivity, in addition to the above-listed materials. The charge generation material may be dispersed evenly or unevenly in the hole transport layer 221. The charge generation material may be p-dopant. The p-dopant may include, for example, a quinone derivative such as TCNQ (tetracyanoquinodimethane) and F4-TCNQ (2,3,5,6-tetrafluoro-tetracyanoquinodimethane), a metal oxide such as tungsten oxide and molybdenum oxide, or a compound containing cyano group.

The second interface layer 225 may be interposed between the hole injection layer 211 and the emissive layer 300. The second interface layer 225 may be a surface layer formed on the surface of the hole injection layer 211 facing the emissive layer 300.

In an exemplary embodiment, the second interface layer 225 may be a stabilization layer that is oxidized when unpaired electrons on the surface of the hole transport layer 221 form bonds with external impurities, e.g., oxygen atoms. In this case, the content of the oxygen atoms in the second interface layer 225 may be, for example, about $10^{19}$ O/cm$^3$. By forming the oxidized interface layer on the surface of the hole transport layer 221, the second interface layer 225 may include fewer oxygen atoms than the above amount, such that the second interface layer 225 may have an appropriate energy barrier allowing holes to be transported over it while the HOMO energy level of the second interface layer 225 may become lower. By doing so, the energy band gap between the holes and electrons recombining in the emissive layer 300 can be increased, such that the luminous efficiency characteristics may be improved. For example, the LUMO energy level of the second interface layer 225 may be less than the LUMO energy level of the emissive layer 300, the HOMO energy level of the second interface layer 225 may be less than the HOMO energy level of the first interface layer 215, the HOMO energy level of the second interface layer 225 may be less than the HOMO energy level of the emissive layer 300, and the HOMO energy level of the second interface layer 225 may be less than the HOMO energy level of the hole transport layer 221. In addition, the absolute value of the difference between the HOMO energy level of the second interface layer 225 and the HOMO energy level of the hole transport layer 221 may be approximately 0.8 eV or more.

Figure 4:
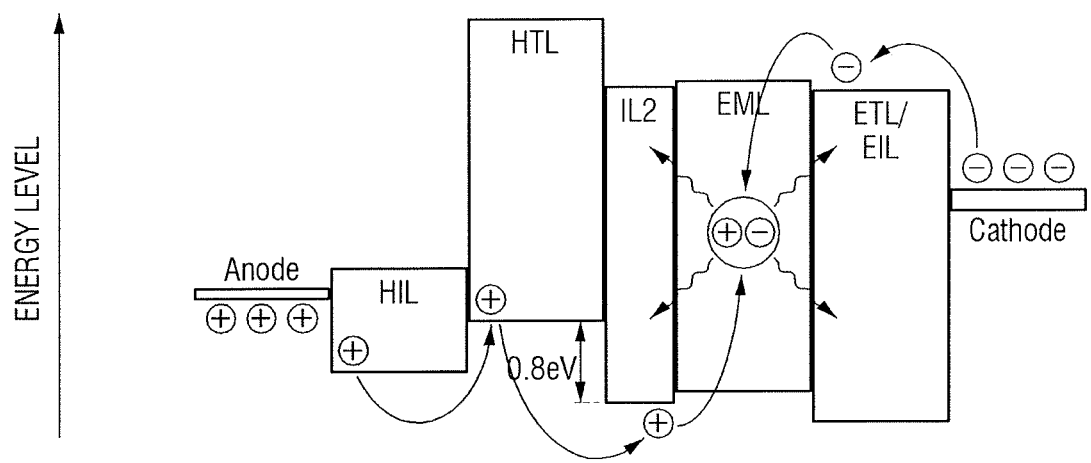
FIG. 4 illustrates a band gap diagram showing luminous efficiency characteristics of an organic light-emitting device including a second interface layer that is a stabilization layer.

FIG. 4 illustrates a band gap diagram for depicting luminous efficiency characteristics of an organic light-emitting device including the second interface layer, where the second interface layer is a stabilization layer.

Referring to FIG. 4, for an organic light-emitting device including the second interface layer in which the content of oxygen atoms is approximately $10^{19}$ O/cm$^3$ or less, the difference between the HOMO energy level of the hole transport layer HTL and the HOMO energy level of the stabilization layer (the second interface layer IL2) may be large, for example, approximately 0.8 eV, and the HOMO energy level of the stabilization layer IL2 may be less than the HOMO energy level of the emissive layer EML. Therefore, the energy band gap between the holes and electrons recombining in the emissive layer may be increased, such that the luminous efficiency characteristics may be stable.

Figure 5:
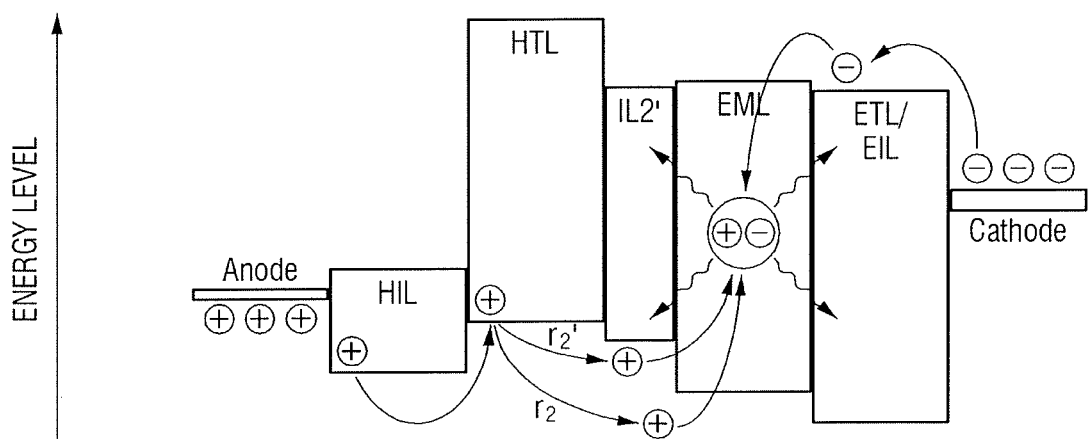
FIG. 5 illustrates a band gap diagram showing luminous efficiency characteristics of an organic light-emitting device including a second interface layer that is a defective layer.

FIG. 5 illustrates a band gap diagram depicting luminous efficiency characteristics of an organic light-emitting device including a second interface layer, where the second interface layer is a defective layer.

Referring to FIG. 5, for an organic light-emitting device including a second interface layer in which the content of oxygen atoms is above $10^{19}$ O/cm$^3$, the HOMO energy level of the defective layer (the second interface layer IL2') is higher than the HOMO energy level of the emissive layer EML, and the barrier between the HOMO energy level of the defective layer IL2' and the HOMO energy level of the hole transport layer HTL is very low. Therefore, the holes supplied from the anode electrode may move in a leakage path r2' along the HOMO energy level of the defective layer IL2', in addition to a normal path r2 along an energy level below the HOMO energy level of the emissive layer EML. Accordingly, the energy band gap between the holes and electrons recombining in the emissive layer may not be large, and the luminous efficiency characteristics may be degraded.

Referring back to FIG. 1, the emissive layer 300 may be disposed on the hole transfer layer 200. The emissive layer 300 may be disposed on the second interface layer 225. The emissive layer 300 may emit light as the holes supplied from the anode electrode 110 and the electrons supplied from the cathode electrode 120 recombine. For example, the holes and the electrons may be supplied into the emissive layer 300 and may recombine to form excitons. The excitons may emit energy in the form of light as the exitons change from an excited state to a ground state. The emissive layer 300 may be made of a luminous material having a conductivity that is less than the conductivity of the hole injection layer 211 and is similar to the conductivity of the hole transport layer 221. The material may include, for example, a fluorescent material or a phosphorescent material emitting red, green and/or blue light.

In an exemplary embodiment, the material of the emissive layer 300 may include a host material and a dopant material. The dopant material may be a fluorescent dopant material or a phosphorescent dopant material. The type of the dopant material may vary depending on the color of the light emitted from the emissive layer 300.

The host material may include, for example, Alq3 (tris-(8-hydroxyquinolato) aluminum(III)), CBP (4,4'-N,N'-dicarbazole-biphenyl), PVK (poly(N-vinylcarbazole)), ADN (9,10-bis(2-naphthalenyl)anthracene), TCTA (4,4',4"-tris(N-carbazolyl)triphenylamine), TPBi (1,3,5-tris(N-phenylbenzimidazole-2-yl)benzene), TBADN (2-(t-butyl)-9,10-bis(2-naphthyl)anthracene), DSA (distyrylarylene), CDBP (4,4'-bis(9-carbazolyl)-2,2'-dimethyl-biphenyl), MADN (2-methyl-9,10-bis(naphthalen-2-yl)anthracene), etc.

The dopant material producing a red wavelength may include a fluorescent material such as PBD:Eu(DBM)3 (Phen) (2-biphenyl-4-yl-5-(4-t-butylphenyl)-1,3,4-oxadiazole:tris(dibenzoylmethane)mono(1,10-phenanthroline)europium(111)) and perylene, a metal complex such as PIQIr (acac) (bis(1-phenylisoquinoline) acetylacetonate iridium), PQIr(acac) (bis(1-phenylquinoline)acetylacetonate iridium), PQIr (tris(1-phenylquinoline)iridium) and PtOEP (octaethylporphyrin platinum), or a phosphorescent material such as organometallic complex. The dopant material producing a green wavelength may include a fluorescent material such as Alq3 (tris-(8-hydroxyquinolato) aluminum(III)), or a phosphorescent material such as Ir(ppy)3 (fac tris(2-phenylpyridine)iridium), Ir(ppy)2(acac) (bis(2-phenylpyridine)(acetylacetonate) iridium(III)) and Ir(mpyp)3 (2-phenyl-4-methylpyridine iridium). The dopant material producing a blue wavelength may include a fluorescent material including one selected from the group consisting of spiro-DPVBi (spiro-4,'-bis(2,2'-diphenylvinyl)1,1'-biphenyl), spiro-6P (spiro-sexiphenyl), DSB (di styrylbenzene), DSA (distyrylarylene), a PFO (polyfluorene) based polymer and a PPV (poly p-phenylene vinylene) base polymer, or a phosphorescent material such as F2Irpic (bis[2-(4,6-difluorophenyl)pyridinato-N,C2']iridium picolinate), (F2ppy)2Ir(tmd) (bis[2-(4,6-difluorophenyl)pyridinato-N,C2']iridium 2,2,6,6-tetramethylheptane-3,5-dione), and Ir(dfppz)3 (tris[1-(4,6-difluorophenyl)pyrazolate-N,C2']iridium). When the organic light-emitting device according to an exemplary embodiment is employed in an OLED device, one of a red emissive layer, a green emissive layer and a blue emissive layer may be disposed in every pixel area, or a red emissive layer, a green emissive layer and a blue emissive layer may be stacked one on another in a pixel area.

The electron transfer layer 400 may be disposed on the emissive layer 300. In an exemplary embodiment, the electron transfer layer 400 may include an electron transport layer 420 and an electron injection layer 410.

The electron transport layer 420 may be disposed on the emissive layer 300. The electron transport layer 420 may transfer the electrons supplied from the electron injection layer 410 toward the emissive layer 300.

The electron transport layer 420 may include, for example, Alq3 (tris-(8-hydroxyquinolato) aluminum(III)), TPBi (1,3,5-tris(N-phenylbenzimidazole-2-yl)benzene), BCP (2,9-dimethyl-4,7-diphenyl-1,10-phenanthroline), Bphen (4,7-diphenyl-1,10-phenanthroline), TAZ (3-(biphenyl-4-yl)-5-(4-tert-butylphenyl)-4-phenyl-4H-1,2,4-triazole), NTAZ (4-(naphthalen-1-yl)-3,5-diphenyl-4H-1,2,4-triazole), tBu-PBD (2-(4-biphenylyl)-5-(4-tert-butyl-phenyl)-1,3,4-oxadiazole), BAlq (Bis(2-methyl-8-quinolinolato-N1, O8)-(1,1'-biphenyl-4-olato)aluminum), Bebq2 (Bis(10-hydroxybenzo[h]quinolinato)beryllium), ADN (9,10-bis(2-naphthyl)anthracene), or a mixture thereof.

The electron injection layer 410 may be disposed on the electron transport layer 420. The electron injection layer 410 may increase the efficiency of injecting electrons supplied from the cathode electrode 120 into the emissive layer 300. For example, the electron injection layer 410 may lower the energy barrier for electron injection, such that electrons may be injected more effectively.

The electron injection layer 410 may include, for example, a lanthanum group metal such as ytterbium (Yb), lithium fluoride (LiF), lithium quinolate (LiQ), lithium oxide (Li$_2$O), barium oxide (BaO), sodium chloride (NaCl), cesium fluoride (CsF), or a metal halide such as rubidium chloride (RbCl) or rubidium iodide (RbI).

In some embodiments, the electron injection layer may include a mixture of the above-listed materials and an insulative organic metal salt. The organic metal salt may be a material having an energy band gap of approximately 4 eV or more. For example, the organic metal salt may include metal acetate, metal benzoate, metal acetoacetate, metal acetylacetonate, or metallic stearate.

The cathode electrode 120 may be disposed on the electron transfer layer 400. When a voltage is applied to the cathode electrode 120, electrons may be injected. The cathode electrode 120 may be disposed on the electron injection layer 410. The cathode electrode 120, like the anode electrode 110, may be a transparent electrode. The cathode electrode 120 may include a conductive material having a work function less than that of the anode electrode 110. The cathode electrode 120 may include, for example, lithium (Li), calcium (Ca), lithium fluoride/calcium (LiF/Ca), lithium fluoride/aluminum (LiF/Al), aluminum (Al), magnesium (Mg), silver (Ag), platinum (Pt), palladium (Pd), nickel (Ni), gold (Au), neodymium (Nd), iridium (Ir), chromium (Cr), barium fluoride (BaF), barium (Ba), or a compound or mixture thereof (e.g., a mixture of silver and magnesium). In an exemplary embodiment, the work function of the cathode electrode 120 may range approximately from 4.1 to 4.26 eV. When the organic light-emitting device according to an exemplary embodiment is employed in an OLED device, the cathode electrode 120 may be a entire-surface electrode or a common electrode.

Hereinafter, a method of manufacturing an organic light-emitting device according to an exemplary embodiment will be described. The identical elements described above with respect to the organic light-emitting device according to the above-described embodiment will not be repeated so as not to unnecessarily obscure the gist of the present disclosure. Such elements will be apparent to those skilled in the art from the accompanying drawings.

Figure 6:
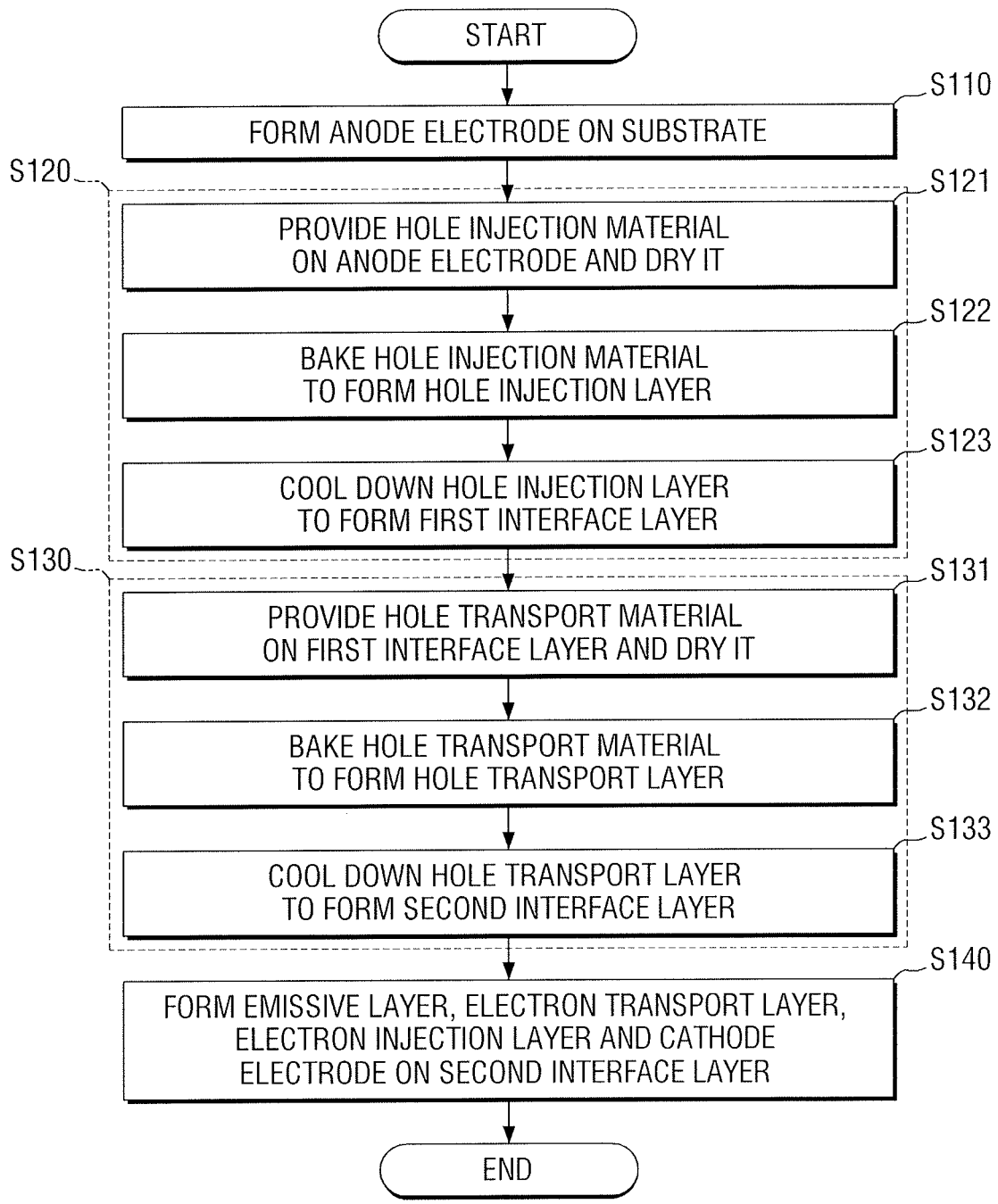
FIG. 6 illustrates a flowchart showing a method of manufacturing an organic light-emitting device according to an exemplary embodiment.

FIG. 6 illustrates a flowchart depicting a method of manufacturing an organic light-emitting device according to an exemplary embodiment. FIGS. 7 to 13 illustrate cross-sectional views showing processing stages of the method illustrated in FIG. 6.

Referring to FIG. 6, the method of manufacturing an organic light-emitting device according to an exemplary embodiment starts with preparing a substrate 10. The method may include forming an anode electrode on the substrate (S110), forming a hole injection layer and a first interface layer on the anode electrode (S120), forming a hole transport layer and a second interface layer on the first interface layer (S130), and forming an emissive layer, an electron transport layer, an electron injection layer and a cathode electrode on the second interface layer (S140). For example, forming the hole injection layer and the first interface layer on the anode electrode (S120) may include supplying a hole injection material onto the anode electrode, drying the supplied material (S121), baking the hole injection material to form the hole injection layer and a first pre-interface layer (S122), and cooling down the hole injection layer and the first pre-interface layer to form the hole injection layer and the first interface layer (S123). Forming the hole transport layer and the second interface layer on the first interface layer (S130) may include supplying a hole transport material onto the first interface layer, drying the hole transport material (S131), baking the hole transport material to form the hole transport layer and the second pre-interface layer (S132), and cooling down the hole transport layer and the second pre-interface layer to form the hole transport layer and the second interface layer (S133).

Figure 7:
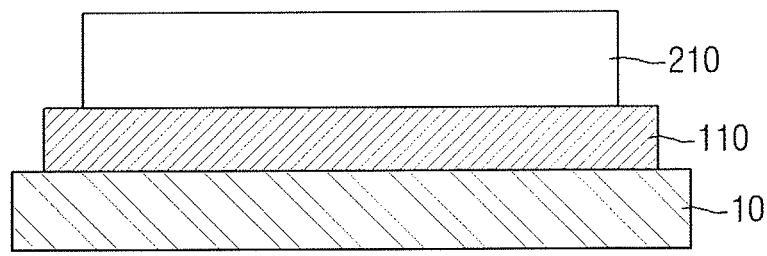
FIGS. 7 to 13 illustrate cross-sectional views showing processing stages of the method illustrated in FIG. 6.

Referring to FIGS. 6 and 7, the substrate 10 may be prepared, and the anode electrode 110 may be formed on the substrate 10. The anode electrode 110 may be formed by a suitable method for forming a pattern. For example, the anode electrode 110 may be formed by depositing and patterning a conductive material and/or a reflective material on the substrate. The material of the anode electrode 110 may be as described above with respect to FIG. 1.

The hole injection material 210 may be supplied onto the anode electrode 110 and dried (S121). The hole injection material 210 may be supplied via a process of applying a solution such as inkjet printing, nozzle printing, etc. The hole injection material 210 may be as described above with respect to FIG. 1.

Figure 8:
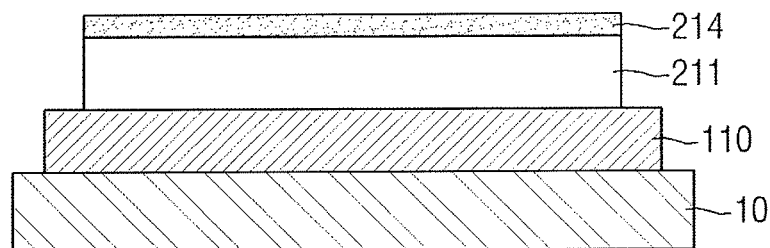
Figure 9:
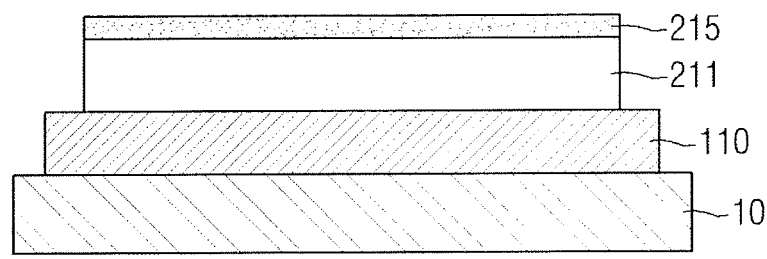

Referring to FIGS. 6 to 8, the hole injection material 210 may be baked, and the hole injection layer 211 and a first pre-interface layer 214 on the surface of the hole injection layer 211 may be formed (S122). Although FIG. 8 shows that the thermal process is carried out from the bottom of the substrate 10, in some implementations, baking the hole injection material may be carried out in a chamber such that heat is transferred evenly to the hole injection material 210 through the top and side surfaces of the hole injection material 210 and the bottom surface of the substrate 10.

In an exemplary embodiment, the hole injection material may include a compound containing a benzenoid structure and/or quinoid structure, and a solvent. The solvent may be, for example, 1,3-dimethyl-2-imidazolidinone (DMI) or propylene glycol (PG). The compound containing the benzenoid structure and/or quinoid structure may include a compound having the structure expressed as Formula 1, a compound having the structure expressed as Formula 2, and/or a compound having the structure expressed as Formula 3 below:

[Chemical Formula 1]
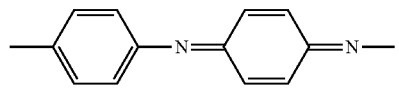

[Chemical Formula 2]
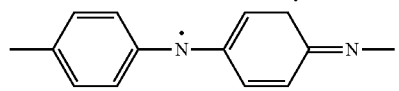

[Chemical Formula 3]
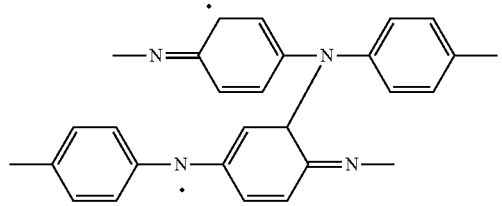

During the process of baking the hole injection material, in at least some of the structures expressed as Formula 1 having the benzenoid structure and the quinoid structure, the quinoid structure may disappear while two unpaired electrons are formed. Thus, the structure expressed as Formula 1 may be changed to the structure expressed as Formula 2. As a result, the ratio of the benzenoid structure to the quinoid structure (benzenoid/quinoid) may be increased. The structure expressed as Formula 2 may contribute to an increase in the conductivity of the hole injection material. The unpaired electrons of Formula 2 may combine with external impurities, e.g., oxygen atoms inside the chamber to thereby form the first pre-interface layer 214.

Further, during a subsequent process of baking the hole injection material, cross-linkage between the structures expressed as Formula 2 may occur. For example, cross-linkage may be created between the unpaired electrons expressed as Formula 2, such that the structure expressed as Formula 2 may be changed to the structure expressed as Formula 3. As a result, the ratio of the benzenoid structure to the quinoid structure (benzenoid/quinoid) may be further increased. In addition, the structure expressed as Formula 3 may contributes to a decrease in the conductivity of the hole injection material. The unpaired electrons of Formula 3 may combine with external impurities, e.g., oxygen atoms inside the chamber to thereby form the first pre-interface layer 214.

Figure 14:
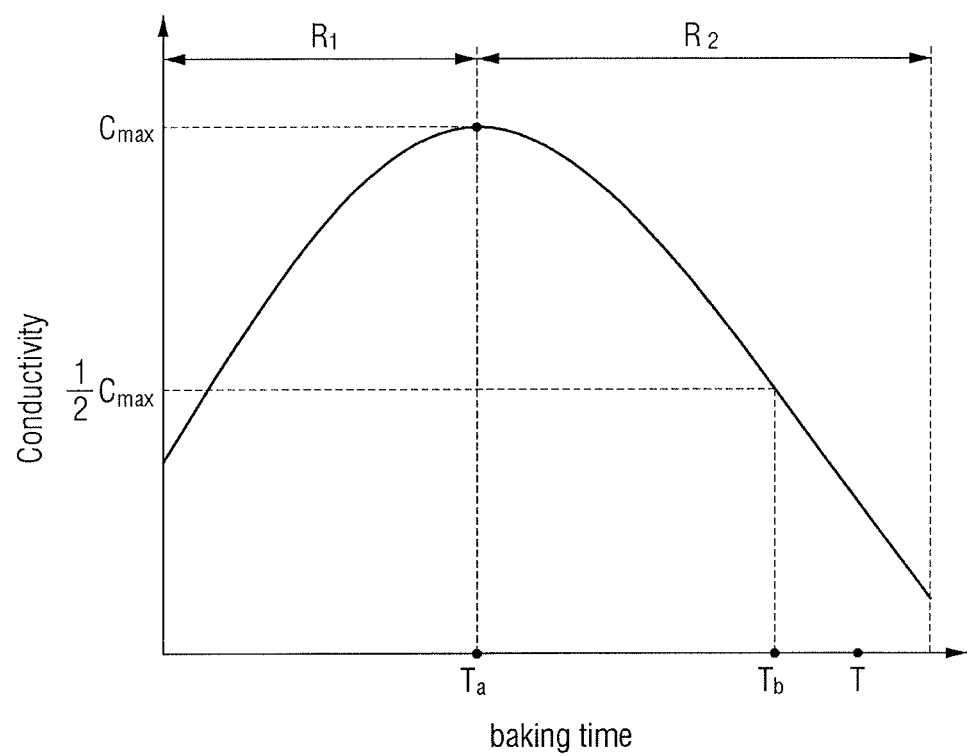
FIG. 14 illustrates a graph showing the change in conductivity of the hole injection layer over baking time of the hole injection material.

FIG. 14 illustrates a graph showing a change in conductivity of the hole injection layer as a function of baking time of the hole injection material 210. Referring to FIG. 14, baking the hole injection material (S122) may include a first interval $R_1$ in which the conductivity of the hole injection material increases according to the baking time of the hole injection material, and a second interval $R_2$ in which the conductivity of the hole injection material decreases according to the baking time of the hole injection material. In the first interval $R_1$, the reaction in which the compound having the structure expressed as Formula 1 is changed to the compound having the structure expressed as Formula 2 may be dominant. In the second interval $R_2$, the reaction in which cross-linkage is formed between compounds having the structure expressed as Formula 2, such that the compound having the structure expressed as Formula 3 is formed, may be dominant.

For example, if the hole injection material 210 is baked for a first time Ta, the hole injection material may exhibit the maximum conductivity Cmax, and the first time Ta may represent a separation between the first interval $R_1$ and the second interval $R_2$. In an exemplary embodiment, the baking of the hole injection material 210 may be carried out for a time T that is longer than a second time Tb at which the hole injection material 210 has the half the maximum conductivity. Generally, it is advantageous to maximize the conductivity of the hole injection layer in order to increase the efficiency of injecting holes into the hole injection layer. In contrast, according to the exemplary embodiment, the hole injection material 210 is baked beyond a time at which the conductivity becomes half the maximum conductivity, such that the stabilization properties of the first interface layer to be described below are improved, thereby improving the lifetime characteristics of the organic light-emitting device. For example, the hole injection material 210 may be baked beyond a time at which the conductivity becomes half the maximum conductivity, such that the ratios $I_B/I_A$, $I_C/I_B$ and $I_D/I_B$ may lie within predetermined ranges, as will be described in detail below. By doing so, the lifetime characteristics of the organic light-emitting device may be improved. In an exemplary embodiment, the hole injection material may be baked for approximately 60 to 180 minutes, or for approximately 80 to 150 minutes, or for approximately 120 minutes.

Subsequently, referring to FIGS. 6 to 9, the hole injection layer 211 and the first pre-interface layer 214 may be cooled down, such that the first interface layer 215 is formed on the surface of the hole injection layer 211 (S123). The first interface layer 215 may be a stabilization layer oxidized by oxygen atoms. In this case, the content of the oxygen atoms in the first interface layer 215 may be approximately $3 \times 10^{21}$ O/cm$^3$ or more.

Cooling down the hole injection layer and the first pre-interface layer (S123) may be carried out in a chamber, e.g., in the same chamber where baking the hole injection material (S122) is carried out. In cooling down the hole injection layer 211 and the first pre-interface layer 214, the rate of change in average temperature per unit time may be approximately –25° C./minute or more, or, for example, –30° C./minute.

In an exemplary embodiment, cooling down the hole injection layer 211 and the first pre-interface layer 214 (S123) may be carried out in a dry air atmosphere. In this case, the content of moisture in the dry air may be approximately 1 ppm (parts per million) or less.

In another exemplary embodiment, cooling down the hole injection layer 211 and the first pre-interface layer 214 (S123) may be carried out in a mixed gas atmosphere containing nitrogen and oxygen. In this case, the volume ratio between nitrogen and oxygen in the mixed gas may be approximately 72:25 to 85:15, or, for example, approximately 80:20. The content of moisture in the mixed gas may be approximately 1 ppm or less. For example, the mixed gas may consist only of nitrogen, oxygen, and moisture of 1 ppm or less. By carrying out the cooling process in the mixed gas atmosphere, it may be possible to sufficiently increase the content of oxygen atoms in the first interface layer 215 while improving luminance characteristics of the organic light-emitting device.

Figure 15:
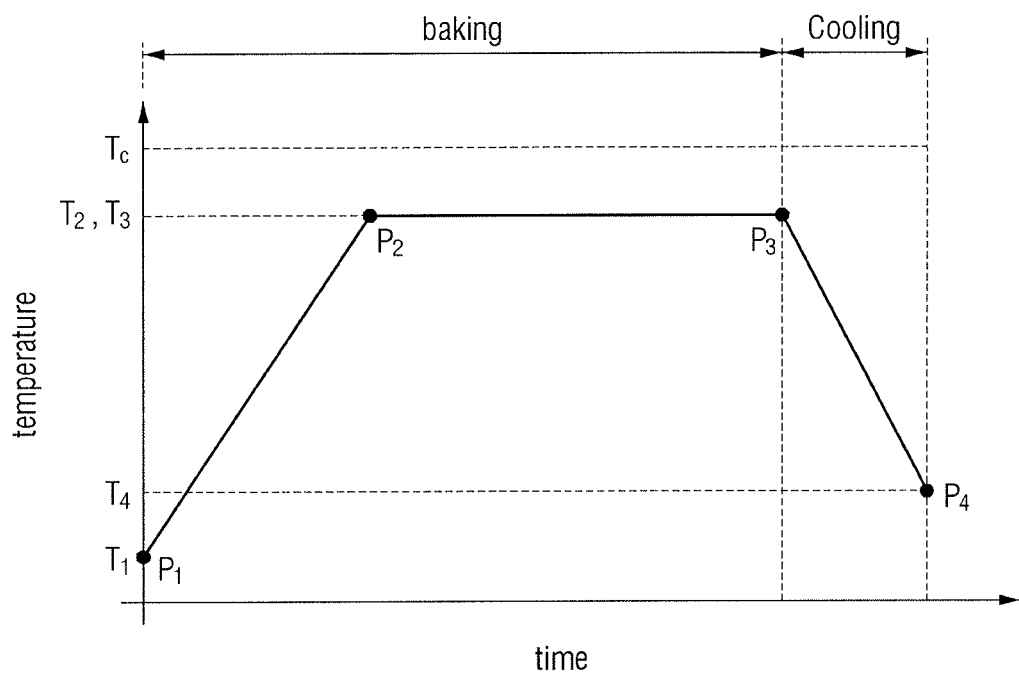
FIG. 15 illustrates a graph for illustrating the temperature change during a baking process and a cooling process of a hole injection layer.

FIG. 15 illustrates a graph showing change in temperature inside a chamber when the baking process and the cooling process of the hole injection layer are continuously carried out in the same chamber.

Referring to FIG. 15, the temperature inside the chamber where baking the hole injection material (S122) is carried out may change from a first temperature $T_1$ to a second temperature $T_2$ higher than the first temperature $T_1$, and then to a third temperature $T_3$. The term "first temperature $T_1$" refers to the temperature at a first point P1, the term "second temperature $T_2$" refers to the temperature at a second point P2, and the term "third temperature $T_3$" refers to the temperature at a third point P3 where the baking is ended. In addition, an upper limit temperature Tc is defined as a threshold temperature at which the properties of the hole injection material change. Under the above condition, the second temperature $T_2$ and the third temperature $T_3$ may be lower than the upper limit temperature Tc, and the third temperature $T_3$ may be equal to, higher than or lower than the second temperature Ta. The rate of change in the average temperature per unit time during the process of changing from the first temperature $T_1$ to the second temperature $T_2$ may be greater than the rate of change in average temperature per unit time during the process of changing from the second temperature $T_2$ to the third temperature $T_3$.

In addition, the temperature inside the chamber where cooling down of the hole injection layer 211 is carried out may change from the third temperature $T_3$ to a fourth temperature $T_4$ lower than the third temperature $T_3$. The third temperature $T_3$ is the temperature inside the chamber when the baking the hole injection layer is ended. Cooling the hole injection layer is started simultaneously. The fourth temperature $T_4$ is the temperature at a fourth point P4 at which the cooling is ended. In this case, the rate of change in average temperature per unit time during the process of changing from the third temperature $T_3$ to the fourth temperature $T_4$ may be approximately –25° C./minute or more, for example, approximately –30° C./minute or more. The rate of change to the fourth temperature $T_4$ may be approximately –100° C./minute.

In the spectrum analysis by Fourier transform infrared spectroscopy (FTIR) of the material of the hole injection layer 211 formed by baking and cooling the hole injection material, a ratio of a peak intensity $I_B$ of benzenoid structure in the material of the hole injection layer 211 at 1521.6 cm$^{-1}$ to 1466.3 cm$^{-1}$ with respect to a peak intensity $I_A$ of quinoid structure in the material of the hole injection layer 211 at 1632.5 cm$^{-1}$ to 1548.4 cm$^{-1}$ ($I_B/I_A$) may be, for example, approximately 1.5 to 2.5, approximately 1.6 to 2.0, or approximately 1.75. In addition, a ratio of a peak intensity $I_C$ of the material of the hole injection layer 211 at 1350.0 cm$^{-1}$ to 1300.0 cm$^{-1}$ with respect to the peak intensity $I_B$ of benzenoid structure in the material of the hole injection layer 211 at 1521.6 cm$^{-1}$ to 1466.3 cm$^{-1}$ ($I_C/I_B$) may be greater than 0 and equal to or less than approximately 10.0. A ratio of a peak intensity $I_D$ of a C—O—C bond in the material of the hole injection layer 211 at 1100.0 cm$^{-1}$ to 1050.0 cm$^{-1}$ with respect to the peak intensity $I_B$ of benzenoid structure in the material of the hole injection layer 211 at 1521.6 cm$^{-1}$ to 1466.3 cm$^{-1}$ ($I_C/I_B$) may be greater than 0 and equal to or less than approximately 5.0. The peaks in the spectrum by the FTIR may be as already described above with respect to FIG. 1.

Figure 10:
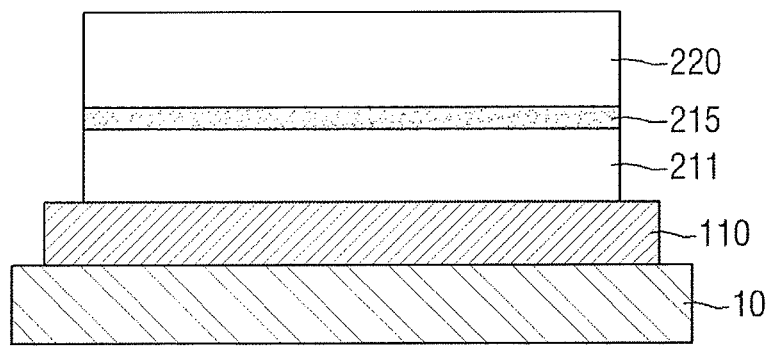

Referring to FIGS. 6 and 10, the hole transport material 220 may be supplied onto the first interface layer 215 and is dried (S131). The hole transport material 220 may be supplied via a process of applying a solution, such as inkjet printing, nozzle printing, etc. The hole transport material 220 may be as described above with respect to FIG. 1.

Figure 11:
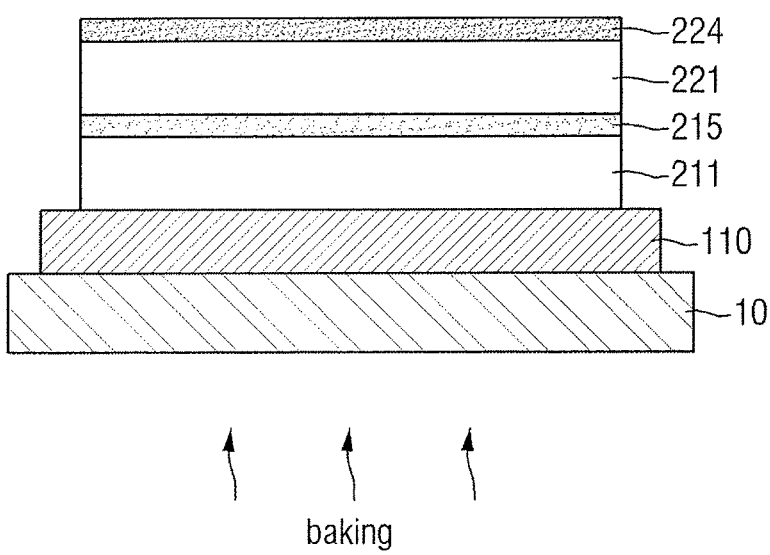

Referring to FIGS. 6 and 11, the hole transport material 220 may be baked, such that the hole transport layer 221 and a second pre-interface layer 224 on the surface of the hole transparent layer 221 are formed (S132). Although FIG. 11 shows that the thermal process is carried out from the bottom of the substrate 10, in some implementations, baking the hole transport material (S132) may be carried out in a chamber such that heat is transferred evenly to the hole transport material 220 through the top and side surfaces of the hole transport material 220 and the bottom surface of the substrate 10.

During the process of baking the hole transport material 220, the surface of the hole transport material 220 may combine with external impurities, e.g., oxygen atoms inside the chamber to thereby form the second pre-interface layer 224.

Figure 12:
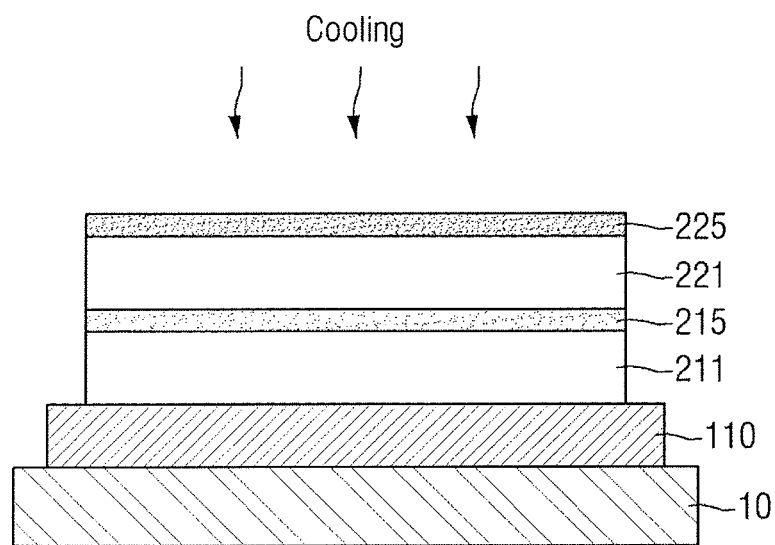

Referring to FIGS. 6 and 12, the hole transport layer 221 and the second pre-interface layer 224 may be cooled down, such that the second interface layer 225 is formed on the surface of the hole transport layer 221. The second interface layer 225 may be a stabilization layer oxidized by oxygen atoms. In this case, the content of the oxygen atoms in the second interface layer 225 may be about $10^{19}$ O/cm$^3$.

Cooling down of the hole transport layer and the second pre-interface layer (S133) may be carried out in a chamber, e.g., in the same chamber where baking the hole transport material (S132) is carried out. In cooling down the hole transport layer 221 and the second pre-interface layer 224, the rate of change in average temperature per unit time may be approximately −25° C./minute or more, or, for example, −30° C./minute or more.

In an exemplary embodiment, cooling down the hole transport layer 221 and the second pre-interface layer 224 may be carried out in a pure nitrogen gas atmosphere (S133). In this case, the content of moisture in the nitrogen gas may be approximately 10 ppb (parts per billion) or less. By carrying out the cooling process in the pure nitrogen atmosphere, it may be possible to control the content of oxygen atoms in second interface layer 225, thereby further improving the luminance characteristics of the organic light-emitting device.

In another exemplary embodiment, cooling down the hole transport layer 221 and the second pre-interface layer 224 may be carried out in a mixed gas atmosphere containing nitrogen and oxygen. In this case, the content of oxygen in the mixed gas may be approximately 1 ppm or less, and the content of moisture in the mixed gas may be approximately 10 ppb or less. For example, the mixed gas may consist only of nitrogen, oxygen and moisture of 10 ppb or less. By carrying out the cooling process at the mixed gas atmosphere, the luminance properties of the organic light-emitting device may be improved while the reliability of the organic light-emitting device may be improved.

In another exemplary embodiment, cooling down the hole transport layer 221 and the second pre-interface layer 224 (S133) may be carried out in a mixed gas atmosphere containing nitrogen and an inert gas. The inert gas may be hydrogen $H_2$ or carbon monoxide CO. In this case, the content of the inert gas may be approximately 1 volume % or less of the entire mixed gas, and the content of moisture of the mixed gas may be approximately 10 ppb or less. For example, the mixed gas may consist only of nitrogen, inert gas, and moisture of 10 ppb or less. By carrying out the cooling process in the mixed gas atmosphere, the luminance of the organic light-emitting device can be improved while the reliability of the organic light-emitting device may be further ensured.

If the baking process and the cooling process of the hole transport layer are continuously carried out in the same chamber, the rate of change in temperature during the baking process and the cooling process of the hole transport layer may be similar to the rate of change in temperature during the baking process and the cooling process of the hole injection layer described above with respect to FIG. 15.

For example, the temperature inside the chamber where baking the hole transport material (S132) is carried out may change from a fifth temperature to a sixth temperature higher than the fourth temperature, and then to a seventh temperature. The seventh temperature refers to the temperature at which the baking is ended. The sixth temperature and the seventh temperature may be lower than a threshold temperature at which the properties of the hole transport material change. The seventh temperature may be equal to, higher than, or lower than the sixth temperature. The rate of change in average temperature per unit time during the process of changing from the fifth temperature to the sixth temperature may be larger than the rate of change in average temperature per unit time during the process of changing from the sixth temperature to the seventh temperature.

The temperature inside the chamber where cooling down the hole transport layer 221 (S133) is carried out may change from the seventh temperature to an eighth temperature lower than the seventh temperature. The seventh temperature may be the temperature inside the chamber when baking the hole transport layer is ended (S132) and cooling the hole transport layer (S133) may be started simultaneously. The eighth temperature may be the temperature when the cooling is ended. The rate of change in average temperature per unit time during the process of changing from the seventh temperature to the eighth temperature may be approximately −25° C./minute or more, or, for example, approximately −30° C./minute or more. For example, the rate of change from the seventh temperature to the eighth temperature may be approximately −100° C./minute.

Figure 13:
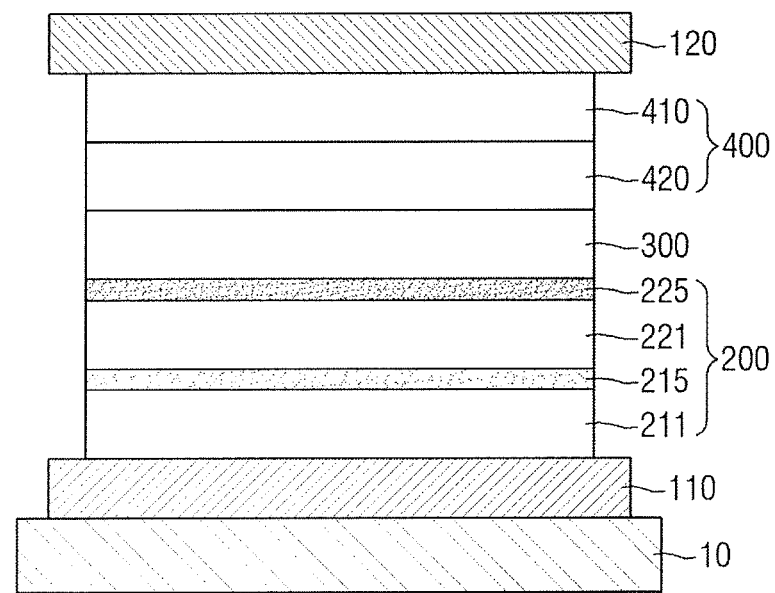

Referring to FIGS. 6 and 13, the emissive layer 300, the electron transport layer 420, the electron injection layer 410, and the cathode electrode 120 may be formed on the second interface layer 225 (S140).

The emissive layer 300, the electron transport layer 420, the electron injection layer 410, and the cathode electrode 120 may be formed on the second interface layer 225 by a suitable method for forming patterns. For example, the emissive layer 300 may be formed via a process of applying a solution. The electron transport layer 420, the electron injection layer 410 and the cathode electrode 120 may be formed via a depositing process. The materials of the emissive layer 300, the electron transport layer 420, the electron injection layer 410 and the cathode electrode 120 may be as described above with respect to FIG. 1.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

An anode electrode containing ITO was formed on an insulation substrate. A hole injection material containing copper phthalocyanine (CuPc) and m-MTDATA was applied onto the anode electrode by inkjet printing, and then baking was carried out in a chamber at 230° C. for 60 minutes. After the baking was ended, cooling was carried out in the same chamber in a dry air atmosphere at the rate of −30° C./minute to 100° C., forming a hole injection layer. The hole transport material containing TPA and TPTE was applied onto the hole injection layer by inkjet printing and baked in a chamber. After the baking, the hole transport material was cooled down to 100° C. in the same chamber at the rate of −30° C./minute, forming a hole transport layer. The material for the emissive layer containing $Alq_3$, BAlq, TPBI, TAZ1, CBP, and CDBP was formed on the hole transport layer. Subsequently, an electron transport layer and an electron injection layer containing lithium-quinolate (LiQ) were formed on the emission layer sequentially. Subsequently, a cathode electrode including aluminum (Al) was formed on the electron injection layer, thereby producing an organic light-emitting device.

Example 2

The anode electrode, the hole injection layer, the hole transport layer, the emissive layer, the electron transport layer, the electron injection layer. and the cathode electrode were formed in the same manner as in Example 1 to produce an organic light-emitting device, except that the hole injection material was baked for 120 minutes in forming the hole injection layer.

Example 3

The anode electrode, the hole injection layer, the hole transport layer, the emissive layer, the electron transport layer, the electron injection layer, and the cathode electrode were formed in the same manner as in Example 1 to produce an organic light-emitting device, except that the hole injection material was baked for 180 minutes in forming the hole injection layer.

Example 4

The anode electrode, the hole injection layer, the hole transport layer, the emissive layer, the electron transport layer, the electron injection layer, and the cathode electrode were formed in the same manner as in Example 2 to produce an organic light-emitting device, except that cooling was carried out in a mixed gas atmosphere consisting only of nitrogen, oxygen, and moisture in forming the hole injection layer after the baking, where the content of moisture was 1 ppm or less and the volume ratio between nitrogen and oxygen was 8:2.

Example 5

The anode electrode, the hole injection layer, the hole transport layer, the emissive layer, the electron transport layer, the electron injection layer and the cathode electrode were formed in the same manner as in Example 2 to produce an organic light-emitting device, except that the cooling was carried out in a pure nitrogen ($N_2$) gas atmosphere in forming the hole transport layer after the baking, where the content of moisture was 10 ppb or less.

Example 6

The anode electrode, the hole injection layer, the hole transport layer, the emissive layer, the electron transport layer, the electron injection layer and the cathode electrode were formed in the same manner as in Example 2 to produce an organic light-emitting device, except that the cooling was carried out in a mixed gas atmosphere consisting only of nitrogen, oxygen, and moisture in forming the hole transport layer after the baking, where the content of moisture was 1 ppb or less and the content of oxygen was 1 ppm.

Example 7

The anode electrode, the hole injection layer, the hole transport layer, the emissive layer, the electron transport layer, the electron injection layer and the cathode electrode were formed in the same manner as in Example 2 to produce an organic light-emitting device, except that the cooling was carried out in a mixture gas atmosphere consisting only of nitrogen, oxygen, and moisture in forming the hole transport layer after the baking, where the content of moisture was 1 ppb or less and the content of hydrogen ($H_2$) was 1 volume %.

Comparative Example 1

The anode electrode, the hole injection layer, the hole transport layer, the emissive layer, the electron transport layer, the electron injection layer, and the cathode electrode were formed in the same manner as in Example 1 to produce an organic light-emitting device, except that the hole injection material was baked for 15 minutes in forming the hole injection layer.

Comparative Example 2

The anode electrode, the hole injection layer, the hole transport layer, the emissive layer, the electron transport layer, the electron injection layer and the cathode electrode were formed in the same manner as in Example 2 to produce an organic light-emitting device, except that cooling after each baking was carried out not in a chamber but outside the chamber naturally to form the hole injection layer and the hole transport layer.

Experimental Example 1

Figure 16:
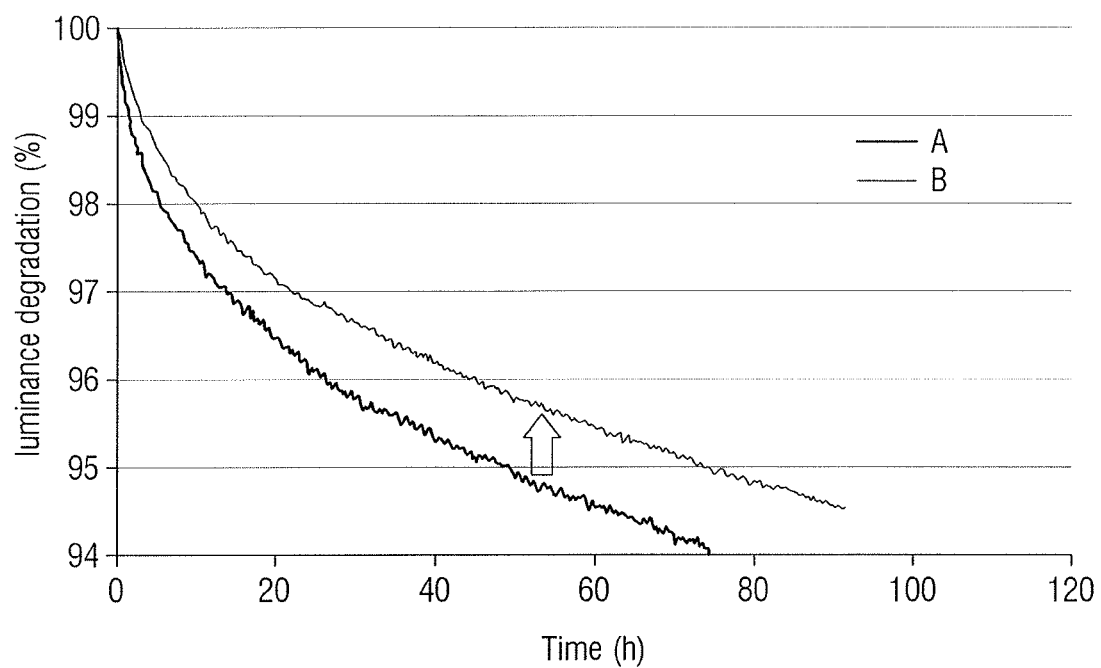
FIG. 16 illustrates a graph showing results of a comparison of lifetime characteristics of an organic light-emitting device manufactured according to Comparative Example 1 after immediately it is manufactured and after ten days.

Evaluation of Stabilization in Lifetime Characteristics of Organic Light-Emitting Device Lifetime characteristics of an organic light-emitting device according to Comparative Example 1 were measured immediately after the organic light-emitting device was manufactured and after ten (10) days. The results are shown in FIG. 16. The lifetime characteristics were be evaluated by measuring a time until the luminance of an organic light-emitting device decreases to 95% of the initial luminance measured when the organic light-emitting device was first driven. That is, the longer the time is, the better the lifetime characteristics are. In FIG. 16, curve A indicates results obtained by measuring the lifetime characteristics of the organic light-emitting device immediately after it is manufactured, and curve B indicates results obtained by measuring the lifetime characteristics of the organic light-emitting device after ten days since it has been manufactured.

Referring to FIG. 16, it took approximately 50 hours until the luminance decreased to 95% of the initial luminance for curve A, while it took approximately 75 hours until the luminance decreased to 95% of the initial luminance for curve B. Accordingly, it can be seen that the lifetime characteristics of curve B is improved over those of curve A. It can also be seen that the lifetime characteristics of the organic light-emitting device according to Comparative Example 1, i.e., the organic light-emitting device manufactured by baking the hole injection material at 230° C. for 15 minutes were unstable, such that it may be difficult to ensure reliability.

Experimental Example 2

Comparison of Lifetime Characteristics Between Examples 1 to 3 and Comparative Example 1

The lifetime characteristics of the organic light-emitting devices according to Examples 1 to 3 and Comparative Example 1 were measured in the same manner as Experimental Example 1. The results are shown in FIG. 17.

Figure 17:
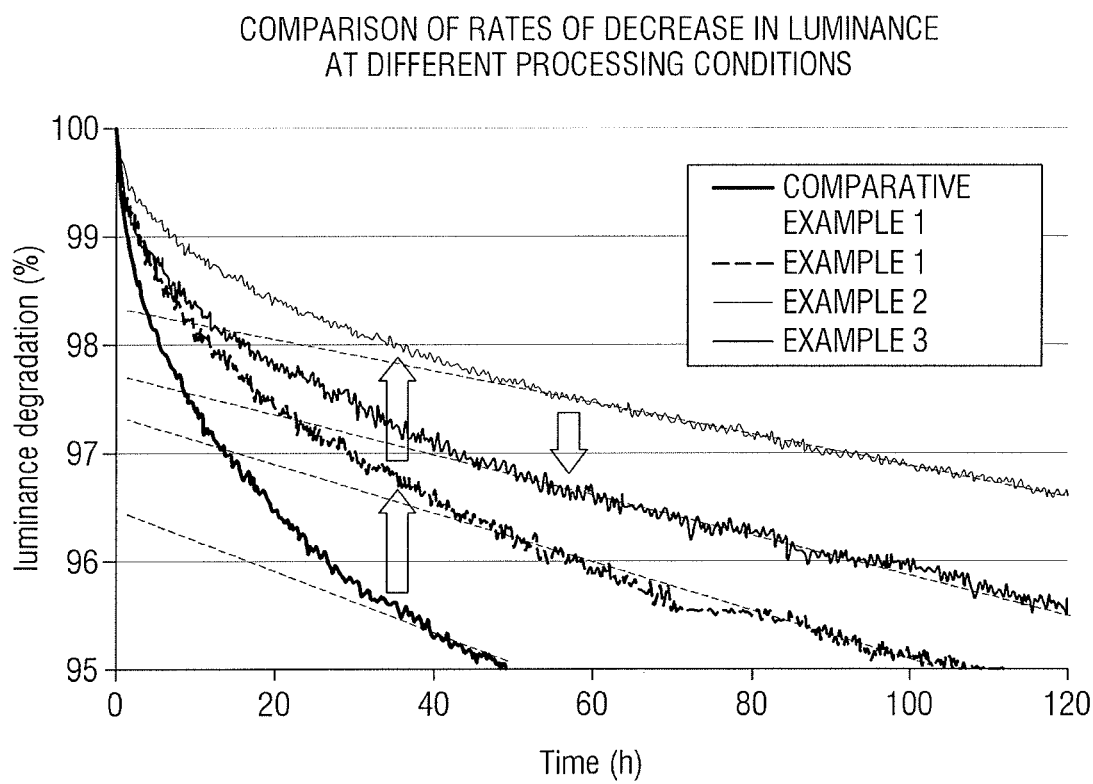
FIG. 17 illustrates a graph showing results of a comparison of lifetime characteristics of the organic light-emitting devices according to Examples 1 to 3 and Comparative Example 1.

Referring to FIG. 17, it took approximately 50 hours until the luminance decreased to 95% of the initial luminance in Comparative Example 1, which exhibited the lowest lifetime characteristics. It took approximately 290 hours in Example 2, which exhibited the best lifetime characteristics. It took approximately 110 hours in Example 3. That is, there was a tendency that as the baking time of the hole injection material increased, the lifetime characteristics increased and then decreased again.

Experimental Example 3

FTIR Measurement in Example 1, Example 2 and Comparative Example 1

Figure 18:
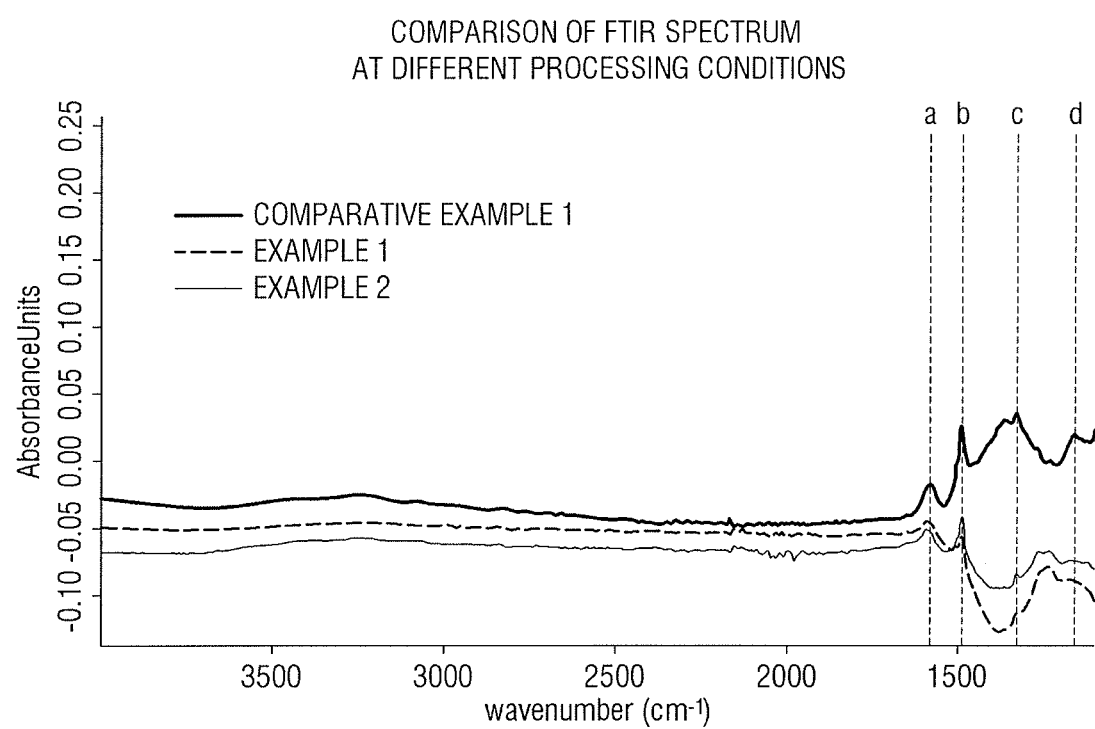
FIG. 18 illustrates a graph showing results of a spectrum analysis by the FTIR on the organic light-emitting devices according to Examples 1 and 2 and Comparative Example 1.

The FTIR spectrums for the hole injection layers of the organic light-emitting devices manufactured according to Examples 1 and 2 and Comparative Example 1 were measured. The results are shown in FIG. 18. In FIG. 18, a denotes a peak for C=N bond of quinoid structure, b denotes a peak for benzenoid structure, c denotes a peak for amide, and d denotes a peak for C—O—C bond.

Experimental Example 4

Comparison of Content of Benzenoid Structure with Content of Quinoid Structure

A ratio of a peak $I_A$ to a peak $I_B$ ($I_B/I_A$) was measured, where $I_A$ refers to the peak intensity at point a, and $I_B$ refers to the peak intensity at point b in the FTIR spectrum of the hole injection layers of the organic light-emitting devices according to Examples 1 and 2 and Comparative Example 1 measured in Experimental Example 3. The results are shown in Table 1 and FIG. 19. The peak intensity was obtained by multiplying the height of the peak by the half-value width.

TABLE 1

|  | $I_B/I_A$ | $I_A$ | $I_B$ |
| --- | --- | --- | --- |
| Comparative Example 1 | 1.32 | 0.43 | 0.57 |
| Example 1 | 1.5 | 0.40 | 0.60 |
| Example 2 | 1.75 | 0.36 | 0.64 |

Figure 19:
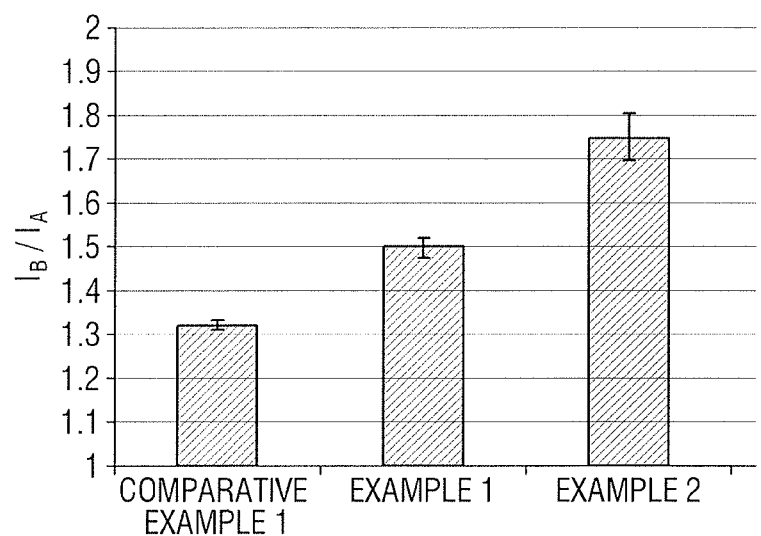
FIG. 19 illustrates a graph showing results of comparison of ratios of peak intensity $I_A$ of quinoid structure to peak intensity $I_B$ of benzenoid structure ($I_B/I_A$) of organic light-emitting devices according to Examples 1 and 2 and Comparative Example 1.

Referring to Table 1 and FIG. 19, the value of $I_B/I_A$ in Comparative Example 1 was approximately 1.32, the value of $I_B/I_A$ in Example 1 was approximately 1.5, and the value of $I_B/I_A$ in Example 2 was approximately 1.75. That is, it can be seen that there is a tendency that the value of $I_B/I_A$ increases as the baking time of the hole injection material increases.

Experimental Example 5

Determination of Factors Affecting Lifetime Characteristics>

Figure 20:
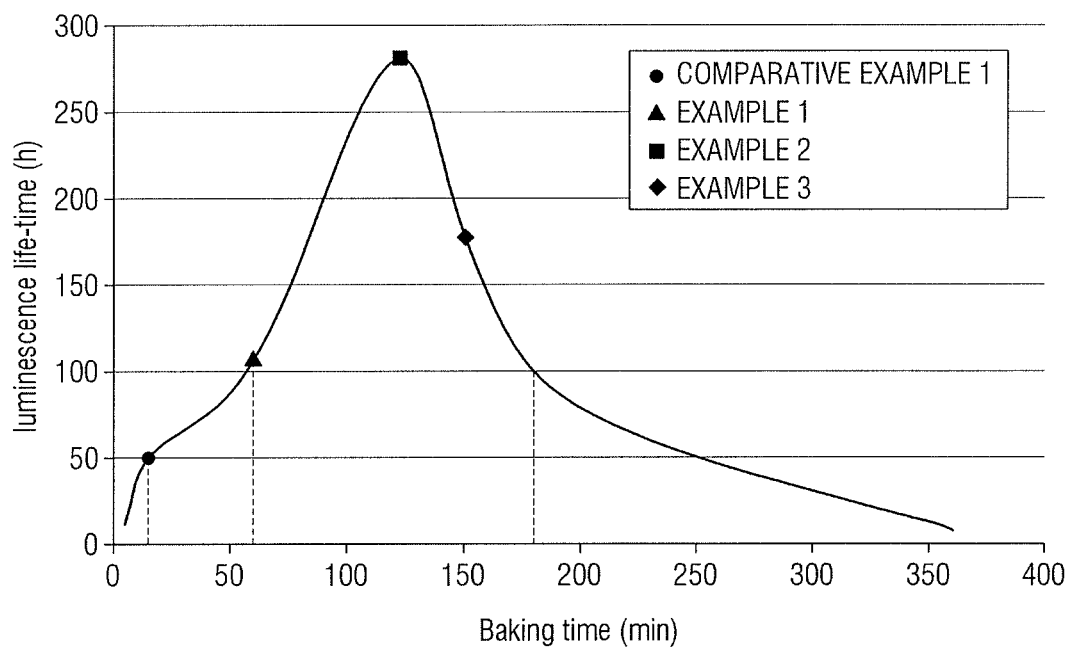
FIG. 20 illustrates a graph showing the relationship between lifetime characteristics of an organic light-emitting device and baking time of a hole injection layer.
Figure 21:
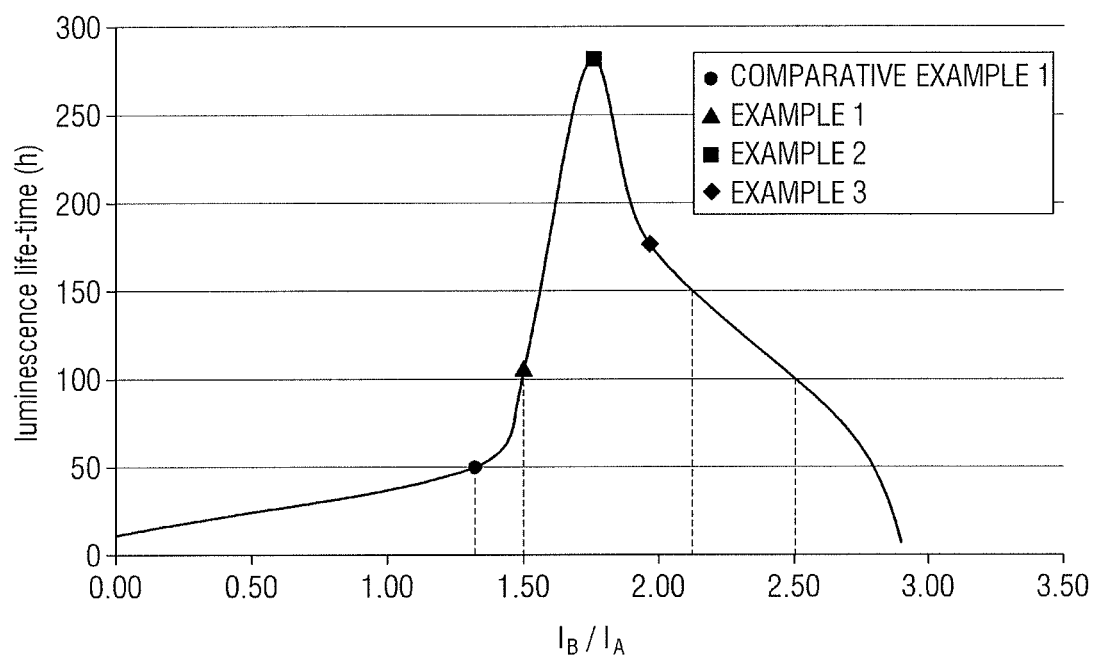
FIG. 21 illustrates a graph showing the relationship between lifetime characteristics of an organic light-emitting device and the value of $I_B/I_A$.
Figure 22:
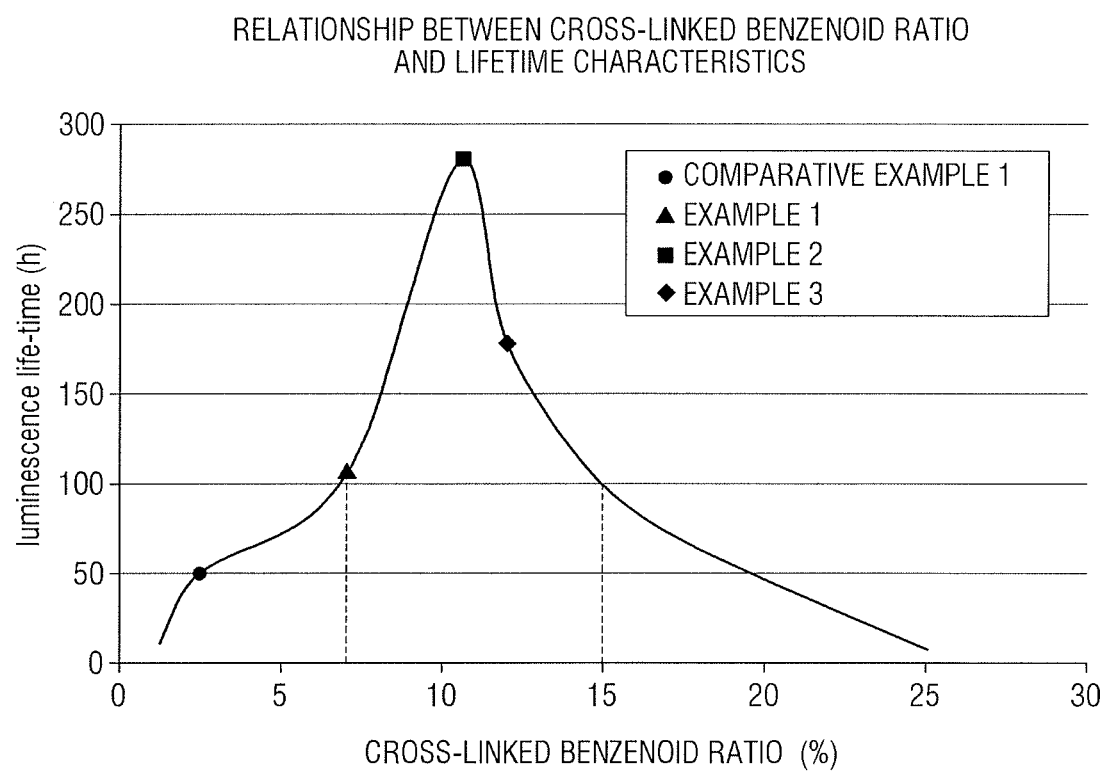
FIG. 22 illustrates a graph showing the relationship between lifetime characteristics of an organic light-emitting device and the ratios of cross-linked benzenoid structure in a hole injection layer.

Lifetime characteristics of the organic light-emitting devices manufactured by varying the baking time of the hole injection layer from 10 minutes to 360 minutes in Examples 1 to 3 and Comparative Example 1 were measured. In doing so, the values of $I_B/I_A$ and the ratios of the benzenoid structure according to baking time were measured, and the results are shown in FIGS. 20 to 22. The lifetime characteristics were evaluated by measuring a time until the luminance of an organic light-emitting device decreases to 95% of the initial luminance measured when the organic light-emitting device was first driven.

By comparing FIGS. 20 to 22 with one another, the relationship among the baking time, the values of $I_B/I_A$ and the ratios of the benzenoid structure can be determined.

In addition, in the relationship between the values of ($I_B/I_A$) and the lifetime characteristics, it can be seen that the rate of increase in the lifetime characteristics was increased by approximately five times around the value of ($I_B/I_A$) of approximately 1.4. The maximum lifetime characteristics were exhibited at the value of 1.75, and there was a change in the rate of decrease in the lifetime characteristics around approximately 1.9. Further, when the value of ($I_B/I_A$) was between approximately 1.5 and 2.5, the time taken until the luminance decreased to 95% of the initial luminance was approximately 100 hours or more, which indicates improved lifetime characteristics over existing organic light-emitting devices.

In addition, in the relationship between the ratio of the cross-linked benzenoid structure and the lifetime characteristics, it can be seen that the rate of increase in the lifetime characteristics was increased by approximately five times around the ratio of the cross-linked benzenoid structure of approximately 5%. The maximum lifetime characteristics were exhibited at approximately 10%, and there was a change in the rate of decrease in the lifetime characteristics around approximately 14%. Further, when the ratio of the cross-linked benzenoid structure was between approximately 7% and 15%, the time taken until the luminance decreased to 95% of the initial luminance was approximately 100 hours or more, which indicates improved lifetime characteristics over existing organic light-emitting devices.

Experimental Example 6

Comparison of Conductivities in Examples 1 to 3 and Comparative Example 1

The current densities according to the voltage applied to the hole injection layers of the organic light-emitting devices manufactured according to Examples 1 and 3 and Comparative Example 1 were measured. The results are shown in FIG. 23.

Figure 23:
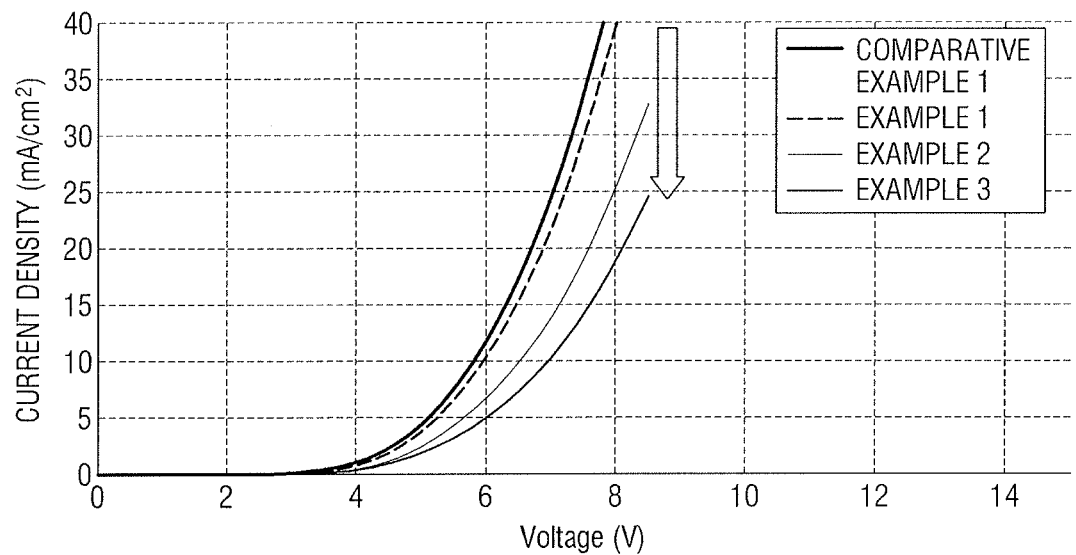
FIG. 23 illustrates a graph showing results of a comparison of conductivity characteristics of organic light-emitting devices according to Examples 1 to 3 and Comparative Example 1.

Referring to FIG. 23, when the voltage of approximately 8 V was applied, the current density in the hole injection layer in Comparative Example 1 was approximately 48 mA/cm², the current density in the hole injection layer in Example 1 was approximately 40 mA/cm², the current density in the hole injection layer in Example 2 was approximately 25 mA/cm², and the current density in the hole injection layer in Example 3 was approximately 20 mA/cm². That is, it can be seen that there is a tendency that the conductivity decreases as the baking time of the hole injection material increases. In particular, it can be seen that the conductivity of the hole injection layer in Example 2 was approximately half the conductivity of the hole injection layer in Comparative Example 1.

Experimental Example 7

Comparison of Luminous Efficiency According to Cooling Condition of Hole Injection Layer Changes in luminance of the organic light-emitting devices manufactured according to Examples 2 and 4 and Comparative Example 2 according to driving time were measured. The results are shown in FIG. 24.

Figure 24:
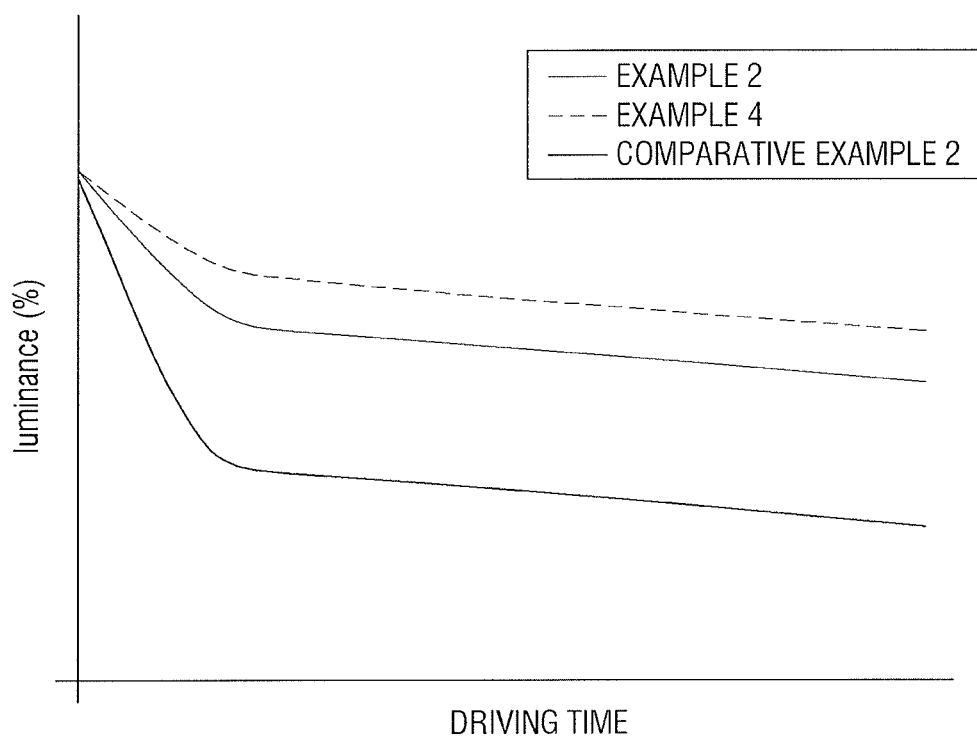
FIG. 24 illustrates a graph showing results of a comparison of luminance characteristics of organic light-emitting devices according to Examples 2 and 4 and Comparative Example 2.

Referring to FIG. 24, for the organic light-emitting device according to Comparative Example 2, the luminance was seriously decreased when the organic light-emitting device was first driven, and the luminance after the organic light-emitting device was stabilized over driving time was also low.

In contrast, for the organic light-emitting device according to Example 2, the luminance when the organic light-emitting device was first driven and the luminance after the organic light-emitting device was stabilized were significantly improved over the luminance values of the organic light-emitting device according to Comparative Example 2. Moreover, for the organic light-emitting device according to Example 4, the luminance when the organic light-emitting device was first driven and the luminance after the organic light-emitting device was stabilized were even further improved over the luminance values of the organic light-emitting device according to Example 2. From the above, it can be seen how the atmosphere in which the hole injection layer is cooled down affects the formation of the stabilization layer on the surface of the hole injection layer.

Experimental Example 8

Comparison of Luminous Efficiencies According to Cooling Condition of Hole Transport Layer Changes in luminance of the organic light-emitting devices manufactured according to Examples 2 and 5 to 7 and Comparative Example 2 according to driving time were measured. The results are shown in FIG. 25.

Figure 25:
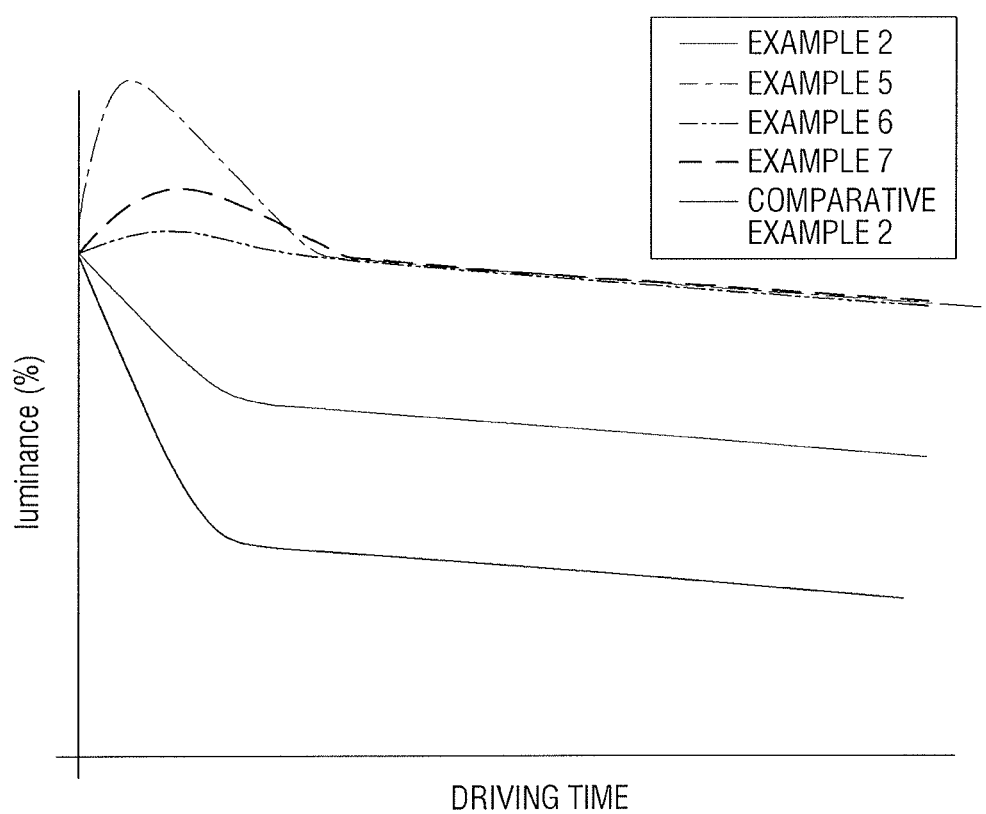
FIG. 25 illustrates a graph showing results of a comparison of luminance characteristics of organic light-emitting devices according to Examples 2 and 5 to 7 and Comparative Example 2.

Referring to FIG. 25, unlike the organic light-emitting devices manufactured according to Example 2 and Comparative Example 2, for the organic light-emitting device according to Example 5, the luminance was increased temporarily when the organic light-emitting device was first driven, and the luminance after the organic light-emitting device was stabilized was significantly better than the luminance values of the organic light-emitting devices according to Example 2 and Comparative Example 2.

In addition, for the organic light-emitting device according to Example 6, the luminance when the organic light-emitting device was first driven was not increased as much as that of the Example 5, and thus, the organic light-emitting device according to Example 6 may be considered to be more reliable. In addition, the luminance after the organic light-emitting device according to Example 6 was stabilized was substantially equal to that of the organic light-emitting device according to Example 5.

In addition, it can be seen that the organic light-emitting device according to Example 7 had the least change in luminance over driving time. Accordingly, the organic light-emitting device according to Example 7 may be considered as having the most desirable luminous efficiency characteristics.

By way of summation and review, a hole transport layer of an organic light-emitting device may deteriorate due to residual electrons remaining after the excitons are formed or by residual excitons in the emissive layer to thereby reduce the lifetime of the organic light-emitting device. Accordingly, it is desirable to improve the lifetime characteristics of an organic light-emitting device.

Embodiments provide an organic light-emitting device with improved luminous efficiency and lifetime characteristics, and a method of manufacturing the same.

According to an exemplary embodiment, when a content ratio between a benzenoid structure and a quinoid structure in a hole injection layer (HIL) lies within a predetermined range, an organic light-emitting device with improved lifetime characteristics may be provided.

According to an exemplary embodiment, when one or more stabilization layers are formed on the interface between a hole injection layer (HIL) and a hole transport layer (HTL) and/or the interface between a hole transport layer (HTL) and an emissive layer (EML), an organic light-emitting device with improved luminous efficiency and lifetime characteristics may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of manufacturing an organic light-emitting device, the method comprising:
   preparing an anode electrode;
   forming a hole injection layer on the anode electrode by providing a hole injection material on the anode electrode and baking the hole injection material to form the hole injection layer;
   forming a hole transport layer on the hole injection layer by providing a hole transport material on the hole injection layer and baking the hole transport material to form the hole transport layer; and
   forming an emissive layer on the hole transport layer,
   wherein baking the hole injection material includes:
      a first interval in which a conductivity of the hole injection material increases over a baking time, and
      a second interval in which the conductivity of the hole injection material decreases over a baking time after the first interval,
   wherein the hole injection material has a maximum conductivity between the first interval and the second interval,
   wherein baking the hole injection material includes baking the hole injection material such that the conductivity of the hole injection material is half, or less than half, of the maximum conductivity, and
   wherein the hole injection material includes copper phthalocyanine (CuPc) and 4,4',4"-tris(N-3-methylphenyl-N-phenylamino)triphenylamine) (m-MTDATA).

2. The method as claimed in claim 1, wherein forming the hole injection layer on the anode electrode further includes cooling the hole injection layer,
   wherein the cooling includes cooling the hole injection layer at a rate of change in average temperature per unit time of −30° C./minute.

3. The method as claimed in claim 2, wherein:
   the cooling includes cooling the hole injection layer in a mixed gas atmosphere containing nitrogen and oxygen,
   a volume ratio between nitrogen and oxygen in the mixed gas ranges from 75:25 to 85:15, and
   a content of moisture in the mixed gas is 1 ppm or less.

4. The method as claimed in claim 2, wherein:
   baking the hole injection material includes baking the hole injection material by varying a temperature inside a chamber from a first temperature to a second temperature higher than the first temperature, and then to a third temperature, cooling the hole injection layer includes cooling the hole injection layer by varying the third temperature to a fourth temperature lower than the third temperature, and a rate of change in temperature per unit time from the first temperature to the second temperature is greater than a rate of change in temperature per unit time from the second temperature to the third temperature.

5. The method as claimed in claim 1, wherein:

forming the hole transport layer on the hole injection layer further includes cooling the hole transport layer, and cooling the hole transport layer includes cooling the hole transport layer at a rate of change in average temperature per unit time of −30° C./minute or more.

6. The method as claimed in claim 5, wherein cooling the hole transport layer includes cooling the hole transport layer in a pure nitrogen gas atmosphere, a content of noise in the pure nitrogen gas being 10 parts per billion (ppb) or less.

7. The method as claimed in claim 5, wherein cooling the hole transport layer includes cooling the hole transport layer in a mixed gas atmosphere containing nitrogen and oxygen, a content of moisture in the mixed gas being 10 ppb or less, and a content of oxygen with respect to the mixed gas being 1 ppm or less.

8. The method as claimed in claim 5, wherein cooling the hole transport layer includes cooling the hole transport layer in a mixed gas atmosphere containing nitrogen and inert gas, the inert gas including hydrogen or carbon monoxide, a content of moisture in the mixed gas being 10 ppb or less, and a content of the inert gas with respect to the mixed gas being 1 volume % or less.

9. The method as claimed in claim 5, wherein:

baking the hole transport material includes baking the hole transport material by varying a temperature inside a chamber from a fifth temperature to a sixth temperature higher than the fifth temperature, and then to a seventh temperature, cooling the hole transport layer includes cooling the hole transport layer by varying the seventh temperature to an eighth temperature lower than the seventh temperature, and a rate of change in temperature per unit time from the fifth temperature to the sixth temperature is greater than a rate of change in temperature per unit time from the sixth temperature to the seventh temperature.

* * * * *